(12) United States Patent
Yao et al.

(10) Patent No.: US 10,936,120 B2
(45) Date of Patent: Mar. 2, 2021

(54) PANEL BOOTSTRAPING ARCHITECTURES FOR IN-CELL SELF-CAPACITANCE

(71) Applicant: Apple Inc., Cupertino, CA (US)

(72) Inventors: Weijun Yao, San Jose, CA (US); Ahmad Al-Dahle, Santa Clara, CA (US); Hyunwoo Nho, Stanford, CA (US); Taif A. Syed, Cupertino, CA (US); Wei Hsin Yao, Palo Alto, CA (US); Yingxuan Li, Saratoga, CA (US)

(73) Assignee: Apple Inc., Cupertino, CA (US)

( * ) Notice: Subject to any disclaimer, the term of this patent is extended or adjusted under 35 U.S.C. 154(b) by 401 days.

(21) Appl. No.: 15/313,549

(22) PCT Filed: May 22, 2014

(86) PCT No.: PCT/US2014/039245
§ 371 (c)(1),
(2) Date: Nov. 22, 2016

(87) PCT Pub. No.: WO2015/178920
PCT Pub. Date: Nov. 26, 2015

(65) Prior Publication Data
US 2017/0139539 A1    May 18, 2017

(51) Int. Cl.
*G06F 3/041* (2006.01)
*G06F 3/044* (2006.01)
*H01L 27/12* (2006.01)

(52) U.S. Cl.
CPC ............ *G06F 3/0418* (2013.01); *G06F 3/044* (2013.01); *G06F 3/0412* (2013.01);
(Continued)

(58) Field of Classification Search
None
See application file for complete search history.

(56) References Cited

U.S. PATENT DOCUMENTS

| | | | |
|---|---|---|---|
| 4,087,625 | A | 5/1978 | Dym et al. |
| 4,090,092 | A | 5/1978 | Serrano |

(Continued)

FOREIGN PATENT DOCUMENTS

| | | | |
|---|---|---|---|
| CN | 1202254 A | 12/1998 | |
| CN | 1246638 A | 3/2000 | |

(Continued)

OTHER PUBLICATIONS

Gibilisco, The Illustrated Dictionary of Electronics, Eighth Edition, p. 173, 2001 (Year: 2001).*

(Continued)

*Primary Examiner* — Dorothy Harris
(74) *Attorney, Agent, or Firm* — Kubota & Basol LLP

(57) ABSTRACT

A self-capacitance touch screen. In some examples, the touch screen comprises a plurality of display pixels, a first display pixel of the plurality of display pixels including a first touch electrode of a plurality of touch electrodes, and a gate line coupled to the first display pixel, wherein the gate line is configured such that a voltage at the gate line substantially follows a voltage at the first touch electrode. In some examples, the gate line is coupled to a resistor, the resistor being configured to decouple the gate line from ground. In some examples, the gate line is coupled to an AC voltage source.

20 Claims, 7 Drawing Sheets

(52) U.S. Cl.
CPC .......... *G06F 3/0416* (2013.01); *H01L 27/124* (2013.01); *H01L 27/1255* (2013.01); *G06F 2203/04104* (2013.01); *G06F 2203/04108* (2013.01)

(56) References Cited

U.S. PATENT DOCUMENTS

| | | | |
|---|---|---|---|
| 4,304,976 A | 12/1981 | Gottbreht et al. | |
| 4,475,235 A | 10/1984 | Graham | |
| 4,550,221 A | 10/1985 | Mabusth | |
| 4,659,874 A | 4/1987 | Landmeier | |
| 5,194,862 A | 3/1993 | Edwards | |
| 5,317,919 A | 6/1994 | Awtrey | |
| 5,483,261 A | 1/1996 | Yasutake | |
| 5,488,204 A | 1/1996 | Mead et al. | |
| 5,631,670 A | 5/1997 | Tomiyoshi et al. | |
| 5,825,352 A | 10/1998 | Bisset et al. | |
| 5,835,079 A | 11/1998 | Shieh | |
| 5,841,078 A | 11/1998 | Miller et al. | |
| 5,841,427 A | 11/1998 | Teterwak | |
| 5,844,506 A | 12/1998 | Binstead | |
| 5,847,690 A | 12/1998 | Boie et al. | |
| 5,880,411 A | 3/1999 | Gillespie et al. | |
| 5,889,236 A | 3/1999 | Gillespie et al. | |
| 5,914,465 A | 6/1999 | Allen et al. | |
| 5,923,997 A * | 7/1999 | Mitanaga | H01L 27/12 438/486 |
| 6,025,647 A | 2/2000 | Shenoy et al. | |
| 6,057,903 A | 5/2000 | Colgan et al. | |
| 6,137,427 A | 10/2000 | Binstead | |
| 6,163,313 A | 12/2000 | Aroyan et al. | |
| 6,188,391 B1 | 2/2001 | Seely et al. | |
| 6,204,897 B1 | 3/2001 | Colgan et al. | |
| 6,239,788 B1 | 5/2001 | Nohno et al. | |
| 6,310,610 B1 | 10/2001 | Beaton et al. | |
| 6,323,846 B1 | 11/2001 | Westerman et al. | |
| 6,329,044 B1 | 12/2001 | Inoue et al. | |
| 6,452,514 B1 | 9/2002 | Philipp | |
| 6,456,952 B1 | 9/2002 | Nathan | |
| 6,587,358 B1 | 7/2003 | Yasumura | |
| 6,690,387 B2 | 2/2004 | Zimmerman et al. | |
| 6,730,863 B1 | 5/2004 | Gerpheide et al. | |
| 6,844,673 B1 | 1/2005 | Bernkopf | |
| 6,847,354 B2 | 1/2005 | Vranish | |
| 6,970,160 B2 | 11/2005 | Mulligan et al. | |
| 7,015,894 B2 | 3/2006 | Morohoshi | |
| 7,030,860 B1 | 4/2006 | Hsu et al. | |
| 7,129,935 B2 | 10/2006 | Mackey | |
| 7,138,686 B1 | 11/2006 | Banerjee et al. | |
| 7,180,508 B2 | 2/2007 | Kent et al. | |
| 7,184,026 B2 | 2/2007 | Gordon et al. | |
| 7,184,064 B2 | 2/2007 | Zimmerman et al. | |
| 7,337,085 B2 | 2/2008 | Soss | |
| 7,395,717 B2 | 7/2008 | DeAngelis et al. | |
| 7,412,586 B1 | 8/2008 | Rajopadhye et al. | |
| 7,504,833 B1 | 3/2009 | Seguine | |
| 7,538,760 B2 | 5/2009 | Hotelling et al. | |
| 7,548,073 B2 | 6/2009 | Mackey et al. | |
| 7,639,234 B2 | 12/2009 | Orsley | |
| 7,663,607 B2 | 2/2010 | Hotelling et al. | |
| 7,701,539 B2 | 4/2010 | Shih et al. | |
| 7,719,523 B2 | 5/2010 | Hillis | |
| 7,898,122 B2 | 3/2011 | Andrieux et al. | |
| 7,907,126 B2 | 3/2011 | Yoon et al. | |
| 7,932,898 B2 | 4/2011 | Philipp et al. | |
| 8,026,904 B2 | 9/2011 | Westerman | |
| 8,040,321 B2 | 10/2011 | Peng et al. | |
| 8,040,326 B2 | 10/2011 | Hotelling et al. | |
| 8,045,783 B2 | 10/2011 | Lee et al. | |
| 8,058,884 B2 | 11/2011 | Betancourt | |
| 8,068,097 B2 | 11/2011 | GuangHai | |
| 8,120,371 B2 | 2/2012 | Day et al. | |
| 8,125,312 B2 | 2/2012 | Orr | |
| 8,149,002 B2 | 4/2012 | Ossart et al. | |
| 8,169,421 B2 | 5/2012 | Wright et al. | |
| 8,223,133 B2 | 7/2012 | Hristov | |
| 8,258,986 B2 | 9/2012 | Makovetskyy | |
| 8,259,078 B2 | 9/2012 | Hotelling et al. | |
| 8,264,428 B2 | 9/2012 | Nam | |
| 8,283,935 B2 | 10/2012 | Liu et al. | |
| 8,339,286 B2 | 12/2012 | Cordeiro | |
| 8,355,887 B1 | 1/2013 | Harding et al. | |
| 8,441,464 B1 | 5/2013 | Lin et al. | |
| 8,479,122 B2 | 7/2013 | Hotelling et al. | |
| 8,484,838 B2 | 7/2013 | Badaye et al. | |
| 8,507,811 B2 | 8/2013 | Hotelling et al. | |
| 8,508,495 B2 | 8/2013 | Hotelling et al. | |
| 8,525,756 B2 | 9/2013 | Kwon | |
| 8,537,126 B2 | 9/2013 | Yousefpor et al. | |
| 8,542,208 B2 | 9/2013 | Krah et al. | |
| 8,552,994 B2 | 10/2013 | Simmons | |
| 8,576,193 B2 | 11/2013 | Hotelling | |
| 8,593,410 B2 | 11/2013 | Hong et al. | |
| 8,593,425 B2 | 11/2013 | Hong et al. | |
| 8,614,688 B2 | 12/2013 | Chang | |
| 8,633,915 B2 | 1/2014 | Hotelling et al. | |
| 8,665,237 B2 | 3/2014 | Koshiyama et al. | |
| 8,680,877 B2 | 3/2014 | Lee et al. | |
| 8,760,412 B2 | 6/2014 | Hotelling et al. | |
| 8,766,950 B1 | 7/2014 | Morein et al. | |
| 8,773,146 B1 | 7/2014 | Hills et al. | |
| 8,773,351 B2 | 7/2014 | Rekimoto | |
| 8,810,543 B1 | 8/2014 | Kurikawa | |
| 8,884,917 B2 | 11/2014 | Seo | |
| 8,902,172 B2 | 12/2014 | Peng et al. | |
| 8,917,256 B2 | 12/2014 | Roziere | |
| 8,922,521 B2 | 12/2014 | Hotelling et al. | |
| 8,957,874 B2 | 2/2015 | Elias | |
| 8,976,133 B2 | 3/2015 | Yao et al. | |
| 8,982,096 B2 | 3/2015 | Hong et al. | |
| 8,982,097 B1 | 3/2015 | Kuzo et al. | |
| 9,000,782 B2 | 4/2015 | Roziere | |
| 9,001,082 B1 | 4/2015 | Rosenberg et al. | |
| 9,024,913 B1 * | 5/2015 | Jung | G09G 3/3655 345/174 |
| 9,035,895 B2 | 5/2015 | Bussat et al. | |
| 9,075,463 B2 | 7/2015 | Pyo et al. | |
| 9,086,774 B2 | 7/2015 | Hotelling et al. | |
| 9,151,791 B2 | 10/2015 | Roziere | |
| 9,189,119 B2 | 11/2015 | Liao et al. | |
| 9,250,757 B2 | 2/2016 | Roziere | |
| 9,261,997 B2 | 2/2016 | Chang et al. | |
| 9,268,427 B2 | 2/2016 | Yousefpor et al. | |
| 9,292,137 B2 | 3/2016 | Kogo | |
| 9,329,674 B2 | 5/2016 | Lee et al. | |
| 9,329,723 B2 | 5/2016 | Benbasat et al. | |
| 9,372,576 B2 | 6/2016 | Westerman | |
| 9,423,897 B2 | 8/2016 | Bae | |
| 9,442,330 B2 | 9/2016 | Huo | |
| 9,448,675 B2 | 9/2016 | Morein et al. | |
| 9,535,547 B2 | 1/2017 | Roziere | |
| 9,582,131 B2 | 2/2017 | Elias | |
| 9,640,991 B2 | 5/2017 | Blondin et al. | |
| 9,690,397 B2 | 6/2017 | Shepelev et al. | |
| 9,785,295 B2 | 10/2017 | Yang et al. | |
| 9,804,717 B2 | 10/2017 | Schropp, Jr. | |
| 9,857,925 B2 | 1/2018 | Morein et al. | |
| 9,874,975 B2 | 1/2018 | Benbasat et al. | |
| 9,880,655 B2 | 1/2018 | O'Connor | |
| 9,886,141 B2 | 2/2018 | Yousefpor | |
| 9,904,427 B1 | 2/2018 | Co et al. | |
| 9,996,175 B2 | 6/2018 | Hotelling et al. | |
| 10,001,888 B2 | 6/2018 | Hong et al. | |
| 10,061,433 B2 | 8/2018 | Imai et al. | |
| 10,120,520 B2 | 11/2018 | Krah et al. | |
| 10,175,832 B2 | 1/2019 | Roziere | |
| 10,289,251 B2 | 5/2019 | Shih et al. | |
| 10,365,764 B2 | 7/2019 | Korapati et al. | |
| 10,386,962 B1 | 8/2019 | Jin et al. | |
| 10,459,587 B2 | 10/2019 | Krah et al. | |
| 2002/0015024 A1 | 2/2002 | Westerman et al. | |
| 2002/0152048 A1 | 10/2002 | Hayes | |
| 2003/0075427 A1 | 4/2003 | Caldwell | |
| 2003/0076325 A1 | 4/2003 | Thrasher | |

(56) References Cited

U.S. PATENT DOCUMENTS

| | | |
|---|---|---|
| 2003/0164820 A1 | 9/2003 | Kent |
| 2003/0210235 A1 | 11/2003 | Roberts |
| 2004/0017362 A1 | 1/2004 | Mulligan et al. |
| 2004/0061687 A1 | 4/2004 | Kent et al. |
| 2004/0090429 A1 | 5/2004 | Geaghan et al. |
| 2004/0119701 A1 | 6/2004 | Mulligan et al. |
| 2004/0140993 A1 | 7/2004 | Geaghan et al. |
| 2004/0188151 A1 | 9/2004 | Gerpheide et al. |
| 2004/0239650 A1 | 12/2004 | Mackey |
| 2004/0241920 A1* | 12/2004 | Hsiao ............... H01L 29/66765 438/158 |
| 2004/0243747 A1 | 12/2004 | Rekimoto |
| 2005/0007353 A1 | 1/2005 | Smith et al. |
| 2005/0012724 A1 | 1/2005 | Kent |
| 2005/0069718 A1 | 3/2005 | Voss-Kehl et al. |
| 2005/0073507 A1 | 4/2005 | Richter et al. |
| 2005/0083307 A1 | 4/2005 | Aufderheide et al. |
| 2005/0104867 A1 | 5/2005 | Westerman et al. |
| 2005/0126831 A1 | 6/2005 | Richter et al. |
| 2005/0146509 A1 | 7/2005 | Geaghan et al. |
| 2005/0219228 A1 | 10/2005 | Alameh et al. |
| 2005/0239532 A1 | 10/2005 | Inamura |
| 2005/0270039 A1 | 12/2005 | Mackey |
| 2005/0270273 A1 | 12/2005 | Marten |
| 2005/0280639 A1 | 12/2005 | Taylor et al. |
| 2006/0001640 A1 | 1/2006 | Lee |
| 2006/0017710 A1 | 1/2006 | Lee et al. |
| 2006/0026521 A1 | 2/2006 | Hotelling et al. |
| 2006/0038791 A1 | 2/2006 | Mackey |
| 2006/0097991 A1 | 5/2006 | Hotelling et al. |
| 2006/0097992 A1 | 5/2006 | Gitzinger et al. |
| 2006/0132463 A1 | 6/2006 | Lee et al. |
| 2006/0146484 A1 | 7/2006 | Kim et al. |
| 2006/0161871 A1 | 7/2006 | Hotelling et al. |
| 2006/0197753 A1 | 9/2006 | Hotelling |
| 2006/0202969 A1 | 9/2006 | Hauck |
| 2006/0203403 A1 | 9/2006 | Schediwy et al. |
| 2006/0227115 A1 | 10/2006 | Fry |
| 2006/0238522 A1 | 10/2006 | Westerman et al. |
| 2006/0267953 A1 | 11/2006 | Peterson et al. |
| 2006/0278444 A1 | 12/2006 | Binstead |
| 2006/0279548 A1 | 12/2006 | Geaghan |
| 2006/0284639 A1 | 12/2006 | Reynolds |
| 2006/0293864 A1 | 12/2006 | Soss |
| 2007/0008299 A1 | 1/2007 | Hristov |
| 2007/0012665 A1 | 1/2007 | Nelson et al. |
| 2007/0023523 A1 | 2/2007 | Onishi |
| 2007/0074914 A1 | 4/2007 | Geaghan et al. |
| 2007/0075982 A1 | 4/2007 | Morrison et al. |
| 2007/0216637 A1 | 9/2007 | Ito |
| 2007/0216657 A1 | 9/2007 | Konicek |
| 2007/0229468 A1 | 10/2007 | Peng et al. |
| 2007/0229470 A1 | 10/2007 | Snyder et al. |
| 2007/0247443 A1 | 10/2007 | Philipp |
| 2007/0262963 A1 | 11/2007 | Xiao-Ping et al. |
| 2007/0262969 A1 | 11/2007 | Pak |
| 2007/0268273 A1 | 11/2007 | Westerman et al. |
| 2007/0268275 A1 | 11/2007 | Westerman et al. |
| 2007/0279395 A1 | 12/2007 | Philipp et al. |
| 2007/0279619 A1 | 12/2007 | Chang |
| 2007/0283832 A1 | 12/2007 | Hotelling |
| 2007/0285365 A1 | 12/2007 | Lee |
| 2007/0296709 A1 | 12/2007 | Guanghai |
| 2008/0006454 A1 | 1/2008 | Hotelling |
| 2008/0007533 A1 | 1/2008 | Hotelling |
| 2008/0012835 A1 | 1/2008 | Rimon et al. |
| 2008/0018581 A1 | 1/2008 | Park et al. |
| 2008/0024456 A1 | 1/2008 | Peng et al. |
| 2008/0036742 A1 | 2/2008 | Garmon |
| 2008/0042985 A1 | 2/2008 | Katsuhito et al. |
| 2008/0042986 A1 | 2/2008 | Westerman et al. |
| 2008/0042987 A1 | 2/2008 | Westerman et al. |
| 2008/0042992 A1 | 2/2008 | Kim |
| 2008/0047764 A1 | 2/2008 | Lee et al. |
| 2008/0061800 A1 | 3/2008 | Reynolds et al. |
| 2008/0062140 A1 | 3/2008 | Hotelling et al. |
| 2008/0062147 A1 | 3/2008 | Hotelling et al. |
| 2008/0062148 A1 | 3/2008 | Hotelling et al. |
| 2008/0062151 A1 | 3/2008 | Kent |
| 2008/0074398 A1 | 3/2008 | Wright |
| 2008/0100572 A1 | 5/2008 | Boillot |
| 2008/0136787 A1 | 6/2008 | Yeh et al. |
| 2008/0136792 A1 | 6/2008 | Peng et al. |
| 2008/0142281 A1 | 6/2008 | Geaghan |
| 2008/0158145 A1 | 7/2008 | Westerman |
| 2008/0158146 A1 | 7/2008 | Westerman |
| 2008/0158167 A1 | 7/2008 | Hotelling et al. |
| 2008/0158172 A1 | 7/2008 | Hotelling et al. |
| 2008/0158174 A1 | 7/2008 | Land et al. |
| 2008/0158181 A1 | 7/2008 | Hamblin et al. |
| 2008/0158182 A1 | 7/2008 | Westerman |
| 2008/0158185 A1 | 7/2008 | Westerman |
| 2008/0162996 A1 | 7/2008 | Krah et al. |
| 2008/0174321 A1 | 7/2008 | Kang et al. |
| 2008/0180365 A1 | 7/2008 | Ozaki |
| 2008/0188267 A1 | 8/2008 | Sagong |
| 2008/0224962 A1 | 9/2008 | Kasai et al. |
| 2008/0231292 A1 | 9/2008 | Ossart et al. |
| 2008/0238871 A1 | 10/2008 | Tam |
| 2008/0246496 A1 | 10/2008 | Hristov et al. |
| 2008/0264699 A1 | 10/2008 | Chang et al. |
| 2008/0277259 A1 | 11/2008 | Chang |
| 2008/0283175 A1 | 11/2008 | Hagood et al. |
| 2008/0303022 A1 | 12/2008 | Tai et al. |
| 2008/0303964 A1* | 12/2008 | Lee ..................... G09G 3/3648 349/33 |
| 2008/0309626 A1 | 12/2008 | Westerman et al. |
| 2008/0309627 A1 | 12/2008 | Hotelling et al. |
| 2008/0309629 A1 | 12/2008 | Westerman et al. |
| 2008/0309632 A1 | 12/2008 | Westerman et al. |
| 2008/0309633 A1 | 12/2008 | Hotelling et al. |
| 2008/0309635 A1 | 12/2008 | Matsuo |
| 2009/0002337 A1 | 1/2009 | Chang |
| 2009/0009485 A1 | 1/2009 | Bytheway |
| 2009/0019344 A1 | 1/2009 | Yoon et al. |
| 2009/0020343 A1 | 1/2009 | Rothkopf et al. |
| 2009/0070681 A1 | 3/2009 | Dawes et al. |
| 2009/0073138 A1 | 3/2009 | Lee et al. |
| 2009/0085894 A1 | 4/2009 | Gandhi et al. |
| 2009/0091546 A1 | 4/2009 | Joo et al. |
| 2009/0091551 A1 | 4/2009 | Hotelling et al. |
| 2009/0109192 A1 | 4/2009 | Liu et al. |
| 2009/0114456 A1 | 5/2009 | Wisniewski |
| 2009/0128516 A1 | 5/2009 | Rimon et al. |
| 2009/0135157 A1 | 5/2009 | Harley |
| 2009/0141046 A1 | 6/2009 | Rathnam et al. |
| 2009/0160787 A1 | 6/2009 | Westerman et al. |
| 2009/0174676 A1 | 7/2009 | Westerman |
| 2009/0174688 A1 | 7/2009 | Westerman |
| 2009/0179868 A1 | 7/2009 | Ayres et al. |
| 2009/0182189 A1 | 7/2009 | Lira |
| 2009/0184937 A1 | 7/2009 | Grivna |
| 2009/0194344 A1 | 8/2009 | Harley et al. |
| 2009/0205879 A1 | 8/2009 | Halsey, IV et al. |
| 2009/0212642 A1 | 8/2009 | Krah |
| 2009/0213090 A1 | 8/2009 | Mamba et al. |
| 2009/0236151 A1 | 9/2009 | Yeh et al. |
| 2009/0238012 A1 | 9/2009 | Tatapudi et al. |
| 2009/0242283 A1 | 10/2009 | Chiu |
| 2009/0251427 A1 | 10/2009 | Hung et al. |
| 2009/0267902 A1 | 10/2009 | Nambu et al. |
| 2009/0267903 A1 | 10/2009 | Cady et al. |
| 2009/0273577 A1 | 11/2009 | Chen et al. |
| 2009/0277695 A1 | 11/2009 | Liu et al. |
| 2009/0303189 A1 | 12/2009 | Grunthaner et al. |
| 2009/0309850 A1 | 12/2009 | Yang |
| 2009/0309851 A1 | 12/2009 | Bernstein |
| 2009/0315854 A1 | 12/2009 | Matsuo |
| 2009/0322702 A1 | 12/2009 | Chien et al. |
| 2010/0001973 A1* | 1/2010 | Hotelling ............ G02F 1/13338 345/174 |
| 2010/0004029 A1 | 1/2010 | Kim |
| 2010/0006350 A1 | 1/2010 | Elias |
| 2010/0007616 A1 | 1/2010 | Jang |

(56) References Cited

U.S. PATENT DOCUMENTS

| | | |
|---|---|---|
| 2010/0013745 A1 | 1/2010 | Kim et al. |
| 2010/0013791 A1 | 1/2010 | Haga et al. |
| 2010/0019779 A1 | 1/2010 | Kato et al. |
| 2010/0031174 A1 | 2/2010 | Kim |
| 2010/0039396 A1 | 2/2010 | Ho et al. |
| 2010/0059294 A1 | 3/2010 | Elias et al. |
| 2010/0060608 A1 | 3/2010 | Yousefpor |
| 2010/0079384 A1 | 4/2010 | Grivna |
| 2010/0079401 A1 | 4/2010 | Staton |
| 2010/0090964 A1 | 4/2010 | Soo et al. |
| 2010/0097346 A1 | 4/2010 | Sleeman |
| 2010/0102027 A1 | 4/2010 | Liu et al. |
| 2010/0110035 A1 | 5/2010 | Selker |
| 2010/0117985 A1 | 5/2010 | Wadia |
| 2010/0123667 A1 | 5/2010 | Kim et al. |
| 2010/0139991 A1 | 6/2010 | Philipp et al. |
| 2010/0143848 A1 | 6/2010 | Jain et al. |
| 2010/0149127 A1 | 6/2010 | Fisher et al. |
| 2010/0156810 A1 | 6/2010 | Barbier et al. |
| 2010/0156846 A1 | 6/2010 | Long et al. |
| 2010/0182018 A1 | 7/2010 | Hazelden |
| 2010/0182278 A1 | 7/2010 | Li et al. |
| 2010/0194695 A1 | 8/2010 | Hotelling et al. |
| 2010/0194696 A1 | 8/2010 | Chang et al. |
| 2010/0194697 A1 | 8/2010 | Hotelling et al. |
| 2010/0194698 A1 | 8/2010 | Hotelling et al. |
| 2010/0194707 A1 | 8/2010 | Hotelling et al. |
| 2010/0201635 A1 | 8/2010 | Klinghult et al. |
| 2010/0245286 A1 | 9/2010 | Parker |
| 2010/0253638 A1 | 10/2010 | Yousefpor et al. |
| 2010/0259503 A1* | 10/2010 | Yanase ............... G06F 3/0416 345/174 |
| 2010/0265187 A1 | 10/2010 | Chang et al. |
| 2010/0265188 A1 | 10/2010 | Chang et al. |
| 2010/0277418 A1 | 11/2010 | Huang et al. |
| 2010/0321305 A1 | 12/2010 | Chang et al. |
| 2010/0328228 A1 | 12/2010 | Elias |
| 2010/0328248 A1 | 12/2010 | Mozdzyn |
| 2010/0328262 A1 | 12/2010 | Huang et al. |
| 2010/0328263 A1 | 12/2010 | Lin |
| 2011/0001491 A1 | 1/2011 | Huang et al. |
| 2011/0006832 A1 | 1/2011 | Land et al. |
| 2011/0006999 A1 | 1/2011 | Chang et al. |
| 2011/0007020 A1 | 1/2011 | Hong et al. |
| 2011/0007021 A1 | 1/2011 | Bernstein et al. |
| 2011/0007030 A1 | 1/2011 | Mo et al. |
| 2011/0025623 A1 | 2/2011 | Lin |
| 2011/0025629 A1 | 2/2011 | Grivna et al. |
| 2011/0025635 A1 | 2/2011 | Lee |
| 2011/0061949 A1 | 3/2011 | Krah et al. |
| 2011/0074705 A1* | 3/2011 | Yousefpor ............... G06F 3/041 345/173 |
| 2011/0080391 A1 | 4/2011 | Brown et al. |
| 2011/0096016 A1 | 4/2011 | Yilmaz |
| 2011/0134050 A1 | 6/2011 | Harley |
| 2011/0157068 A1 | 6/2011 | Parker et al. |
| 2011/0157093 A1 | 6/2011 | Bita et al. |
| 2011/0169783 A1 | 7/2011 | Wang et al. |
| 2011/0199105 A1 | 8/2011 | Otagaki et al. |
| 2011/0210941 A1 | 9/2011 | Reynolds et al. |
| 2011/0227874 A1 | 9/2011 | Fahraeus et al. |
| 2011/0231139 A1 | 9/2011 | Yokota et al. |
| 2011/0234523 A1 | 9/2011 | Chang et al. |
| 2011/0241907 A1 | 10/2011 | Cordeiro |
| 2011/0248949 A1 | 10/2011 | Chang et al. |
| 2011/0254795 A1 | 10/2011 | Chen |
| 2011/0261005 A1 | 10/2011 | Joharapurkar et al. |
| 2011/0261007 A1 | 10/2011 | Joharapurkar et al. |
| 2011/0282606 A1 | 11/2011 | Ahed et al. |
| 2011/0298727 A1* | 12/2011 | Yousefpor ........... G02F 1/13338 345/173 |
| 2011/0310033 A1 | 12/2011 | Liu et al. |
| 2011/0310064 A1 | 12/2011 | Keski-Jaskari et al. |
| 2012/0026099 A1 | 2/2012 | Harley |
| 2012/0044199 A1 | 2/2012 | Karpin et al. |
| 2012/0050206 A1 | 3/2012 | Welland |
| 2012/0050214 A1 | 3/2012 | Kremin et al. |
| 2012/0050216 A1 | 3/2012 | Kremin et al. |
| 2012/0050217 A1* | 3/2012 | Noguchi ............... G06F 3/0416 345/174 |
| 2012/0054379 A1 | 3/2012 | Leung et al. |
| 2012/0056662 A1 | 3/2012 | Wilson et al. |
| 2012/0056851 A1 | 3/2012 | Chen et al. |
| 2012/0075239 A1 | 3/2012 | Azumi et al. |
| 2012/0092288 A1 | 4/2012 | Wadia |
| 2012/0098776 A1 | 4/2012 | Chen et al. |
| 2012/0113047 A1 | 5/2012 | Hanauer et al. |
| 2012/0132006 A1 | 5/2012 | Roziere |
| 2012/0146726 A1 | 6/2012 | Huang et al. |
| 2012/0146920 A1* | 6/2012 | Lin ........................ G06F 3/041 345/173 |
| 2012/0146942 A1 | 6/2012 | Kamoshida et al. |
| 2012/0154324 A1 | 6/2012 | Wright et al. |
| 2012/0162121 A1* | 6/2012 | Chang ................... G06F 3/0416 345/174 |
| 2012/0162133 A1 | 6/2012 | Chen et al. |
| 2012/0162134 A1 | 6/2012 | Chen et al. |
| 2012/0169652 A1 | 7/2012 | Chang |
| 2012/0169653 A1 | 7/2012 | Chang |
| 2012/0169655 A1 | 7/2012 | Chang |
| 2012/0169656 A1 | 7/2012 | Chang |
| 2012/0169664 A1 | 7/2012 | Milne |
| 2012/0182251 A1* | 7/2012 | Krah ..................... G06F 3/0412 345/174 |
| 2012/0187965 A1 | 7/2012 | Roziere |
| 2012/0188200 A1 | 7/2012 | Roziere |
| 2012/0188201 A1 | 7/2012 | Binstead |
| 2012/0211264 A1 | 8/2012 | Milne |
| 2012/0242597 A1 | 9/2012 | Hwang et al. |
| 2012/0249401 A1 | 10/2012 | Omoto |
| 2012/0262395 A1 | 10/2012 | Chan |
| 2012/0262410 A1 | 10/2012 | Lim |
| 2012/0274603 A1 | 11/2012 | Kim et al. |
| 2012/0287068 A1 | 11/2012 | Colgate et al. |
| 2012/0313881 A1 | 12/2012 | Ge et al. |
| 2012/0320385 A1 | 12/2012 | Mu et al. |
| 2013/0015868 A1 | 1/2013 | Peng |
| 2013/0021291 A1 | 1/2013 | Kremin et al. |
| 2013/0027118 A1 | 1/2013 | Ho et al. |
| 2013/0027346 A1 | 1/2013 | Yarosh et al. |
| 2013/0038573 A1 | 2/2013 | Chang et al. |
| 2013/0057511 A1 | 3/2013 | Shepelev et al. |
| 2013/0069911 A1 | 3/2013 | You |
| 2013/0076647 A1 | 3/2013 | Yousefpor et al. |
| 2013/0076648 A1* | 3/2013 | Krah ..................... G06F 3/0412 345/173 |
| 2013/0093712 A1 | 4/2013 | Liu et al. |
| 2013/0100071 A1 | 4/2013 | Wright et al. |
| 2013/0120303 A1 | 5/2013 | Hong et al. |
| 2013/0127739 A1 | 5/2013 | Guard et al. |
| 2013/0141343 A1 | 6/2013 | Yu et al. |
| 2013/0141383 A1 | 6/2013 | Woolley |
| 2013/0154996 A1 | 6/2013 | Trend et al. |
| 2013/0170116 A1 | 7/2013 | In et al. |
| 2013/0173211 A1 | 7/2013 | Hoch et al. |
| 2013/0176271 A1 | 7/2013 | Sobel et al. |
| 2013/0176273 A1 | 7/2013 | Li et al. |
| 2013/0176276 A1 | 7/2013 | Shepelev |
| 2013/0181943 A1 | 7/2013 | Bulea et al. |
| 2013/0194229 A1 | 8/2013 | Sabo et al. |
| 2013/0215049 A1 | 8/2013 | Lee |
| 2013/0215075 A1 | 8/2013 | Lee et al. |
| 2013/0224370 A1 | 8/2013 | Cok et al. |
| 2013/0234964 A1 | 9/2013 | Kim et al. |
| 2013/0257785 A1 | 10/2013 | Brown et al. |
| 2013/0257797 A1 | 10/2013 | Wu et al. |
| 2013/0257798 A1 | 10/2013 | Tamura et al. |
| 2013/0265276 A1 | 10/2013 | Obeidat et al. |
| 2013/0271427 A1 | 10/2013 | Benbasat et al. |
| 2013/0278447 A1 | 10/2013 | Kremin |
| 2013/0278498 A1 | 10/2013 | Jung et al. |
| 2013/0278525 A1 | 10/2013 | Lim et al. |
| 2013/0278543 A1 | 10/2013 | Hsu et al. |
| 2013/0307821 A1 | 11/2013 | Kogo |

(56) References Cited

U.S. PATENT DOCUMENTS

| | | |
|---|---|---|
| 2013/0308031 A1 | 11/2013 | Theuwissen |
| 2013/0314342 A1* | 11/2013 | Kim .................. G06F 3/041 345/173 |
| 2013/0320994 A1* | 12/2013 | Brittain ............. G06F 3/0416 324/537 |
| 2013/0321289 A1 | 12/2013 | Dubery et al. |
| 2013/0328759 A1* | 12/2013 | Al-Dahle ............ G02F 1/1309 345/89 |
| 2013/0335342 A1 | 12/2013 | Kim et al. |
| 2013/0342479 A1 | 12/2013 | Pyo et al. |
| 2014/0002406 A1 | 1/2014 | Cormier et al. |
| 2014/0009438 A1 | 1/2014 | Liu et al. |
| 2014/0022186 A1 | 1/2014 | Hong et al. |
| 2014/0022201 A1 | 1/2014 | Boychuk et al. |
| 2014/0043546 A1 | 2/2014 | Yamazaki et al. |
| 2014/0049507 A1 | 2/2014 | Shepelev et al. |
| 2014/0070823 A1 | 3/2014 | Roziere |
| 2014/0071084 A1 | 3/2014 | Sugiura |
| 2014/0078096 A1 | 3/2014 | Tan et al. |
| 2014/0078097 A1 | 3/2014 | Shepelev et al. |
| 2014/0098051 A1 | 4/2014 | Hong et al. |
| 2014/0103712 A1 | 4/2014 | Blondin et al. |
| 2014/0104194 A1 | 4/2014 | Davidson et al. |
| 2014/0104225 A1 | 4/2014 | Davidson et al. |
| 2014/0104228 A1 | 4/2014 | Chen et al. |
| 2014/0111496 A1 | 4/2014 | Gomez et al. |
| 2014/0118270 A1 | 5/2014 | Moses et al. |
| 2014/0125357 A1 | 5/2014 | Blondin et al. |
| 2014/0125628 A1 | 5/2014 | Yoshida et al. |
| 2014/0132534 A1 | 5/2014 | Kim |
| 2014/0132560 A1 | 5/2014 | Huang et al. |
| 2014/0132860 A1 | 5/2014 | Hotelling et al. |
| 2014/0145997 A1 | 5/2014 | Tiruvuru |
| 2014/0152615 A1 | 6/2014 | Chang et al. |
| 2014/0160058 A1 | 6/2014 | Chen et al. |
| 2014/0168540 A1 | 6/2014 | Wang et al. |
| 2014/0204058 A1 | 7/2014 | Huang et al. |
| 2014/0210779 A1* | 7/2014 | Katsuta ................ G06F 3/044 345/174 |
| 2014/0225838 A1 | 8/2014 | Gupta et al. |
| 2014/0232955 A1* | 8/2014 | Roudbari ............ G06F 3/041 349/12 |
| 2014/0240291 A1 | 8/2014 | Nam |
| 2014/0247245 A1 | 9/2014 | Lee |
| 2014/0253470 A1 | 9/2014 | Havilio |
| 2014/0267070 A1 | 9/2014 | Shahparnia et al. |
| 2014/0267146 A1 | 9/2014 | Chang et al. |
| 2014/0267165 A1 | 9/2014 | Roziere |
| 2014/0285469 A1 | 9/2014 | Wright et al. |
| 2014/0306924 A1 | 10/2014 | Lin et al. |
| 2014/0333582 A1 | 11/2014 | Huo |
| 2014/0347321 A1 | 11/2014 | Roziere |
| 2014/0347574 A1 | 11/2014 | Tung et al. |
| 2014/0362029 A1 | 12/2014 | Mo et al. |
| 2014/0362030 A1 | 12/2014 | Mo et al. |
| 2014/0362034 A1 | 12/2014 | Mo et al. |
| 2014/0368436 A1 | 12/2014 | Abzarian et al. |
| 2014/0368460 A1 | 12/2014 | Mo et al. |
| 2014/0375598 A1 | 12/2014 | Shen et al. |
| 2014/0375603 A1 | 12/2014 | Hotelling et al. |
| 2014/0375903 A1 | 12/2014 | Westhues et al. |
| 2015/0002176 A1 | 1/2015 | Kwon et al. |
| 2015/0002448 A1 | 1/2015 | Brunet et al. |
| 2015/0002464 A1 | 1/2015 | Nishioka et al. |
| 2015/0002752 A1 | 1/2015 | Shepelev et al. |
| 2015/0009421 A1 | 1/2015 | Choi et al. |
| 2015/0015528 A1 | 1/2015 | Vandermeijden |
| 2015/0026398 A1 | 1/2015 | Kim |
| 2015/0035768 A1 | 2/2015 | Shahpamia et al. |
| 2015/0035787 A1 | 2/2015 | Shahpamia et al. |
| 2015/0035797 A1 | 2/2015 | Shahparnia |
| 2015/0042600 A1 | 2/2015 | Lukanc et al. |
| 2015/0042607 A1 | 2/2015 | Takanohashi |
| 2015/0049043 A1 | 2/2015 | Yousefpor |
| 2015/0049044 A1 | 2/2015 | Yousefpor et al. |
| 2015/0077375 A1 | 3/2015 | Hotelling et al. |
| 2015/0084911 A1 | 3/2015 | Stronks et al. |
| 2015/0091587 A1 | 4/2015 | Shepelev et al. |
| 2015/0091843 A1 | 4/2015 | Ludden |
| 2015/0091849 A1* | 4/2015 | Ludden ................ G06F 3/0412 345/174 |
| 2015/0103047 A1 | 4/2015 | Hanauer et al. |
| 2015/0116263 A1 | 4/2015 | Kim |
| 2015/0123939 A1 | 5/2015 | Kim et al. |
| 2015/0194470 A1 | 7/2015 | Hwang |
| 2015/0227240 A1 | 8/2015 | Hong et al. |
| 2015/0242028 A1 | 8/2015 | Roberts et al. |
| 2015/0248177 A1 | 9/2015 | Maharyta |
| 2015/0253907 A1 | 9/2015 | Elias |
| 2015/0268789 A1 | 9/2015 | Liao et al. |
| 2015/0268795 A1 | 9/2015 | Kurasawa et al. |
| 2015/0277648 A1 | 10/2015 | Small |
| 2015/0309610 A1 | 10/2015 | Rabii et al. |
| 2015/0324035 A1 | 11/2015 | Yuan et al. |
| 2015/0338937 A1 | 11/2015 | Shepelev et al. |
| 2015/0370387 A1 | 12/2015 | Yamaguchi et al. |
| 2015/0378465 A1 | 12/2015 | Shih et al. |
| 2016/0018348 A1 | 1/2016 | Yau et al. |
| 2016/0022218 A1 | 1/2016 | Hayes et al. |
| 2016/0034102 A1 | 2/2016 | Roziere et al. |
| 2016/0041629 A1 | 2/2016 | Rao et al. |
| 2016/0048234 A1 | 2/2016 | Chandran et al. |
| 2016/0062533 A1 | 3/2016 | O'Connor |
| 2016/0077667 A1 | 3/2016 | Chiang et al. |
| 2016/0098114 A1 | 4/2016 | Pylvas |
| 2016/0117017 A1 | 4/2016 | Kremin et al. |
| 2016/0139728 A1 | 5/2016 | Jeon et al. |
| 2016/0154505 A1 | 6/2016 | Chang et al. |
| 2016/0154529 A1 | 6/2016 | Westerman |
| 2016/0170533 A1 | 6/2016 | Roziere |
| 2016/0188040 A1 | 6/2016 | Shin et al. |
| 2016/0211808 A1 | 7/2016 | Lee et al. |
| 2016/0224177 A1 | 8/2016 | Krah |
| 2016/0224189 A1 | 8/2016 | Yousefpor et al. |
| 2016/0246403 A1 | 8/2016 | Zhao et al. |
| 2016/0246423 A1 | 8/2016 | Fu |
| 2016/0253034 A1 | 9/2016 | Gupta et al. |
| 2016/0253041 A1 | 9/2016 | Park et al. |
| 2016/0259448 A1 | 9/2016 | Guarneri |
| 2016/0266676 A1 | 9/2016 | Wang et al. |
| 2016/0266679 A1 | 9/2016 | Shahparnia et al. |
| 2016/0282980 A1 | 9/2016 | Chintalapoodi et al. |
| 2016/0283023 A1 | 9/2016 | Shin et al. |
| 2016/0299603 A1 | 10/2016 | Tsujioka et al. |
| 2016/0320898 A1 | 11/2016 | Tang et al. |
| 2016/0357344 A1 | 12/2016 | Benbasat et al. |
| 2017/0090619 A1 | 3/2017 | Yousefpor et al. |
| 2017/0090644 A1 | 3/2017 | Yao et al. |
| 2017/0097703 A1 | 4/2017 | Lee |
| 2017/0108968 A1 | 4/2017 | Roziere |
| 2017/0168619 A1 | 6/2017 | Yang et al. |
| 2017/0168626 A1 | 6/2017 | Konicek |
| 2017/0220156 A1 | 8/2017 | Blondin et al. |
| 2017/0229502 A1 | 8/2017 | Liu et al. |
| 2017/0262121 A1 | 9/2017 | Kurasawa et al. |
| 2017/0269729 A1 | 9/2017 | Chintalapoodi |
| 2017/0285804 A1 | 10/2017 | Yingxuan et al. |
| 2017/0315646 A1 | 11/2017 | Roziere |
| 2017/0351378 A1 | 12/2017 | Wang et al. |
| 2017/0357371 A1 | 12/2017 | Kim et al. |
| 2018/0032176 A1 | 2/2018 | Krah et al. |
| 2018/0067584 A1 | 3/2018 | Zhu et al. |
| 2018/0074633 A1 | 3/2018 | Kida et al. |
| 2018/0107309 A1 | 4/2018 | Endo et al. |
| 2018/0275824 A1 | 9/2018 | Li et al. |
| 2018/0307374 A1 | 10/2018 | Shah et al. |
| 2018/0307375 A1 | 10/2018 | Shah et al. |
| 2018/0314385 A1 | 11/2018 | Gupta et al. |
| 2019/0034032 A1 | 1/2019 | Westerman |
| 2019/0073061 A1 | 3/2019 | Krah et al. |
| 2019/0087051 A1 | 3/2019 | Yao et al. |

(56) References Cited

U.S. PATENT DOCUMENTS

| | | | |
|---|---|---|---|
| 2019/0138152 | A1 | 5/2019 | Yousefpor et al. |
| 2020/0019265 | A1 | 1/2020 | Krah et al. |

FOREIGN PATENT DOCUMENTS

| | | | |
|---|---|---|---|
| CN | 1527274 | A | 9/2004 |
| CN | 1672119 | A | 9/2005 |
| CN | 1689677 | A | 11/2005 |
| CN | 1711520 | A | 12/2005 |
| CN | 1739083 | A | 2/2006 |
| CN | 1782837 | A | 6/2006 |
| CN | 1818842 | A | 8/2006 |
| CN | 1864124 | A | 11/2006 |
| CN | 1945516 | A | 4/2007 |
| CN | 101046720 | A | 10/2007 |
| CN | 101071354 | A | 11/2007 |
| CN | 101122838 | A | 2/2008 |
| CN | 101349957 | A | 1/2009 |
| CN | 101419516 | A | 4/2009 |
| CN | 201218943 | y | 4/2009 |
| CN | 101840293 | A | 9/2010 |
| CN | 101859215 | A | 10/2010 |
| CN | 102023768 | A | 4/2011 |
| CN | 102411460 | A | 4/2012 |
| CN | 102483659 | A | 5/2012 |
| CN | 102483673 | A | 5/2012 |
| CN | 102760405 | A | 10/2012 |
| CN | 102804114 | A | 11/2012 |
| CN | 103049148 | A | 4/2013 |
| CN | 103052930 | A | 4/2013 |
| CN | 103135815 | A | 6/2013 |
| CN | 103221910 | A | 7/2013 |
| CN | 103258492 | A | 8/2013 |
| CN | 103294321 | A | 9/2013 |
| CN | 103365506 | A | 10/2013 |
| CN | 103577008 | A | 2/2014 |
| CN | 103809810 | A | 5/2014 |
| CN | 103885627 | A | 6/2014 |
| CN | 104020880 | A | 9/2014 |
| CN | 104020908 | A | 9/2014 |
| CN | 104142757 | A | 11/2014 |
| CN | 104252266 | A | 12/2014 |
| CN | 105045446 | A | 11/2015 |
| CN | 102648446 | B | 1/2016 |
| CN | 105278739 | A | 1/2016 |
| CN | 105474154 | A | 4/2016 |
| DE | 112008001245 | T5 | 3/2010 |
| DE | 102011089693 | A1 | 6/2013 |
| DE | 112012004912 | T5 | 8/2014 |
| EP | 853230 | A1 | 7/1998 |
| EP | 1192585 | A1 | 4/2002 |
| EP | 1391807 | A1 | 2/2004 |
| EP | 1455264 | A2 | 9/2004 |
| EP | 1573706 | A2 | 9/2005 |
| EP | 1573706 | A3 | 9/2005 |
| EP | 1192585 | B1 | 12/2005 |
| EP | 1644918 | A2 | 4/2006 |
| EP | 1717677 | A2 | 11/2006 |
| EP | 1745356 | A2 | 1/2007 |
| EP | 1455264 | A3 | 3/2007 |
| EP | 1717677 | A3 | 1/2008 |
| EP | 1986084 | A1 | 10/2008 |
| EP | 2077489 | A1 | 7/2009 |
| EP | 2 144 146 | A1 | 1/2010 |
| EP | 2148264 | A2 | 1/2010 |
| EP | 2224277 | A1 | 9/2010 |
| EP | 2256606 | A2 | 12/2010 |
| EP | 1455264 | B1 | 5/2011 |
| FR | 2756048 | A1 | 5/1998 |
| FR | 2 896 595 | | 7/2007 |
| FR | 2949008 | A1 | 2/2011 |
| FR | 3004551 | A1 | 10/2014 |
| GB | 1546317 | A | 5/1979 |
| GB | 2144146 | A | 2/1985 |
| GB | 2428306 | A | 1/2007 |
| GB | 2437827 | A | 11/2007 |
| GB | 2450207 | A | 12/2008 |
| JP | 10-505183 | | 5/1998 |
| JP | 2000-163031 | A | 6/2000 |
| JP | 2002-342033 | A | 11/2002 |
| JP | 2003-066417 | A | 3/2003 |
| JP | 2004-503835 | A | 2/2004 |
| JP | 2004-526265 | A | 8/2004 |
| JP | 2005-84128 | A | 3/2005 |
| JP | 2005-301373 | A | 10/2005 |
| JP | 2006-251927 | A | 9/2006 |
| JP | 2007-18515 | A | 1/2007 |
| JP | 2008-510251 | A | 4/2008 |
| JP | 2008-117371 | A | 5/2008 |
| JP | 2008-225415 | A | 9/2008 |
| JP | 2009-86240 | A | 4/2009 |
| JP | 2009-157373 | A | 7/2009 |
| JP | 2010-528186 | A | 8/2010 |
| KR | 10-2004-0002983 | A | 1/2004 |
| KR | 10-2004-0091728 | A | 10/2004 |
| KR | 10-2007-0002327 | A | 1/2007 |
| KR | 10-2008-00 19125 | A | 3/2008 |
| KR | 10-2008-0041278 | A | 5/2008 |
| KR | 10-2010-0054899 | A | 5/2010 |
| KR | 10-2011-0044670 | A | 4/2011 |
| KR | 10-2012-0085737 | A | 8/2012 |
| KR | 10-2013-0054463 | A | 5/2013 |
| KR | 10-20 13-0094495 | A | 8/2013 |
| KR | 10-2013-0117499 | A | 10/2013 |
| KR | 10-2014-0043395 | A | 4/2014 |
| KR | 10-2014-0074454 | A | 6/2014 |
| KR | 10-1609992 | B1 | 4/2016 |
| TW | 200715015 | A | 4/2007 |
| TW | 200826032 | A | 6/2008 |
| TW | 200835294 | A | 8/2008 |
| TW | M341273 | U | 9/2008 |
| TW | M344522 | U | 11/2008 |
| TW | M344544 | U | 11/2008 |
| TW | M352721 | U | 3/2009 |
| TW | 201115442 | A | 5/2011 |
| TW | 201203069 | A | 1/2012 |
| TW | 201401129 | A | 1/2014 |
| TW | 201419071 | A | 5/2014 |
| WO | 1997/018508 | A1 | 5/1997 |
| WO | 1999/035633 | A2 | 7/1999 |
| WO | 1999/035633 | A3 | 9/1999 |
| WO | 2000/073984 | A1 | 12/2000 |
| WO | 2001/097204 | A1 | 12/2001 |
| WO | 2002/080637 | A1 | 10/2002 |
| WO | 2003/079176 | A2 | 9/2003 |
| WO | 2004/013833 | A2 | 2/2004 |
| WO | 2004/013833 | A3 | 8/2004 |
| WO | 2004/114265 | A2 | 12/2004 |
| WO | 2005/114369 | A2 | 12/2005 |
| WO | 2005/114369 | A3 | 1/2006 |
| WO | 2006/020305 | A2 | 2/2006 |
| WO | 2006/023147 | A2 | 3/2006 |
| WO | 2006/023147 | A3 | 5/2006 |
| WO | 2006/104745 | A2 | 10/2006 |
| WO | 2006/126703 | A2 | 11/2006 |
| WO | 2006/130584 | A2 | 12/2006 |
| WO | 2007/012899 | A1 | 2/2007 |
| WO | 2007/034591 | A1 | 3/2007 |
| WO | 2006/020305 | A3 | 5/2007 |
| WO | 2006/104745 | A3 | 5/2007 |
| WO | 2006/130584 | A3 | 5/2007 |
| WO | 2007/054018 | A1 | 5/2007 |
| WO | 2007/058727 | A1 | 5/2007 |
| WO | 2007/066488 | A1 | 6/2007 |
| WO | 2007/089766 | A2 | 8/2007 |
| WO | 2007/115032 | A2 | 10/2007 |
| WO | 2007/146780 | A2 | 12/2007 |
| WO | 2007/146785 | A2 | 12/2007 |
| WO | 2007/115032 | A3 | 1/2008 |
| WO | 2008/000964 | A1 | 1/2008 |
| WO | 2008/007118 | A2 | 1/2008 |
| WO | 2008/030780 | A1 | 3/2008 |
| WO | 2008/047990 | A1 | 4/2008 |
| WO | 2007/146785 | A3 | 5/2008 |

(56) References Cited

FOREIGN PATENT DOCUMENTS

| WO | 2008/076237 | A2 | 6/2008 |
|---|---|---|---|
| WO | 2008/007118 | A3 | 8/2008 |
| WO | 2008/076237 | A3 | 8/2008 |
| WO | 2007/089766 | A3 | 9/2008 |
| WO | 2007/146780 | A3 | 9/2008 |
| WO | 2008/108514 | A1 | 9/2008 |
| WO | 2008/135713 | A1 | 11/2008 |
| WO | 2009/103946 | A1 | 8/2009 |
| WO | 2010/088659 | A1 | 8/2010 |
| WO | 2010/117882 | A2 | 10/2010 |
| WO | 2011/015795 | A2 | 2/2011 |
| WO | 2011/028451 | A1 | 3/2011 |
| WO | 2011/071784 | A1 | 6/2011 |
| WO | 2011/015795 | A3 | 7/2011 |
| WO | 2011/137200 | A1 | 11/2011 |
| WO | 2013/093327 | A1 | 6/2013 |
| WO | 2013/158570 | A1 | 10/2013 |
| WO | WO-2014/127716 | A1 | 8/2014 |
| WO | 2015/023410 | A1 | 2/2015 |
| WO | WO-2015/017196 | A1 | 2/2015 |
| WO | WO-2015/072722 | A1 | 5/2015 |
| WO | WO-2015/107969 | A1 | 7/2015 |
| WO | 2015/178920 | A1 | 11/2015 |
| WO | WO-2016/048269 | A1 | 3/2016 |
| WO | 2016/069642 | A1 | 5/2016 |
| WO | WO-2016/066282 | A1 | 5/2016 |
| WO | WO-2016/126525 | A1 | 8/2016 |
| WO | WO-2016/144437 | A1 | 9/2016 |
| WO | WO-2017/058415 | A2 | 4/2017 |

OTHER PUBLICATIONS

O'Connor, mTouchTM Projected Capacitive Touch Screen Sensing Theory of Operation, Microchip TB3064, 2010, pp. 1-16 Year: 2010).*

Lowe, "Electronics Components: How to Use an Op Amp as a Voltage Comparator", 2012 10 pages downloaded from https://www.dummies.com/programming/electronics/components/electronics-components-how-to-use-an-op-amp-as-a-voltage-comparator/ Apr. 20, 2020 (Year: 2012).*

Non-Final Office Action dated Dec. 14, 2016, for U.S. Appl. No. 14/550,686, filed Nov. 21, 2014, eight pages.

Notice of Allowance dated Dec. 2, 2016, for U.S. Appl. No. 14/615,186, filed Feb. 5, 2015, seven pages.

Final Office Action dated May 14, 2018, for U.S. Appl. No. 15/006,987, filed Jan. 26, 2016, 11 pages.

Final Office Action dated May 17, 2018, for U.S. Appl. No. 15/017,463, filed Feb. 5, 2016, 22 pages.

Non-Final Office Action dated Sep. 14, 2017 , for U.S. Appl. No. 15/017,463, filed Feb. 5, 2016, 22 pages.

Notice of Allowance dated Sep. 20, 2017, for U.S. Appl. No. 14/082,003, filed Nov. 15, 2013, eight pages.

Notice of Allowance dated Sep. 20, 2017, for U.S. Appl. No. 15/144,706, filed May 2, 2016, nine pages.

Non-Final Office Action dated Apr. 3, 2018, for U.S. Appl. No. 14/318,157, filed Jun. 27, 2014, twelve pages.

Notice of Allowance dated Mar. 1, 2018, for U.S. Appl. No. 14/645,120, filed Mar. 11, 2015, five pages.

Final Office Action dated Aug. 16, 2018, for U.S. Appl. No. 14/993,017, filed Jan. 11, 2016, 35 pages.

European Search Report dated Jan. 31, 2018, for EP Application No. 17183937.6, four pages.

Non-Final Office Action dated Jan. 22, 2018 , for U.S. Appl. No. 15/097,179, filed Apr. 12, 2016, 11 pages.

Notice of Allowance dated Feb. 9, 2018, for U.S. Appl. No. 14/550,686, filed Nov. 21, 2014, 11 pages.

Non-Final Office Action dated Dec. 16, 2016, for U.S. Appl. No. 14/645,120, filed Mar. 11, 2015, ten pages.

Non-Final Office Action dated Dec. 19, 2016, for U.S. Appl. No. 14/318,157, filed Jun. 27, 2014, eleven pages.

Non-Final Office Action dated Jun. 20, 2018, for U.S. Appl. No. 15/009,774, filed Jan. 28, 2016, 17 pages.

Final Office Action dated Jul. 27, 2018, for U.S. Appl. No. 15/097,179, filed Apr. 12, 2016, 11 pages.

Non-Final Office Action dated Mar. 13, 2017, for U.S. Appl. No. 14/082,003, filed Nov. 15, 2013, 20 pages.

Non-Final Office Action dated Apr. 7, 2017, for U.S. Appl. No. 15/144,706, filed May 2, 2016, eight pages.

Final Office Action dated Dec. 5, 2017, for U.S. Appl. No. 15/006,987, filed Jan. 26, 2016, 16 pages.

Non-Final Office Action dated Dec. 22, 2017 , for U.S. Appl. No. 14/993,017, filed Jan. 11, 2016, 23 pages.

Non-Final Office Action dated Jun. 14, 2017, for U.S. Appl. No. 15/006,987, filed Jan. 26, 2016, 14 pages.

Notice of Allowance dated Oct. 3, 2017, for U.S. Appl. No. 14/082,003, filed Nov. 15, 2013, nine pages.

Notice of Allowance dated Oct. 13, 2017, for U.S. Appl. No. 14/558,529, filed Dec. 2, 2014, eight pages.

Advisory Action received for U.S. Appl. No. 11/818,498, dated May 17, 2013, 5 pages.

Advisory Action received for U.S. Appl. No. 11/818,498, dated Oct. 14, 2011, 5 pages.

Advisory Action received for U.S. Appl. No. 12/206,680, dated Apr. 16, 2012, 3 pages.

Advisory Action received for U.S. Appl. No. 12/238,333, dated Dec. 17. 2013, 3 pages.

Advisory Action received for U.S. Appl. No. 12/238,333, dated Oct. 21. 2015, 4 pages.

Advisory Action received for U.S. Appl. No. 12/500,911, dated May 17, 2013, 3 pages.

Advisory Action received for U.S. Appl. No. 12/642,466, dated May 23, 2013, 2 pages.

Advisory Action received for U.S. Appl. No. 14/082,003, dated Mar. 10, 2016, 3 pages.

Advisory Action received for U.S. Appl. No. 14/645,120, dated Nov. 25, 2016, 3 pages.

Advisory Action received for U.S. Appl. No. 15/017,463, dated Aug. 8, 2018, 3 pages.

Cassidy, R., "The Tissot T-Touch Watch—A Groundbreaking Timepiece", Available online at: <http://ezinearticles.com/?The-Tissot-T-Touch-Watch---A-Groundbreakin!-Timepiece&id . . . >, Feb. 23, 2007, 2 pages.

Decision to Grant received for European Patent Application No. 16704768.7, dated May 23, 2019, 1 page.

Extended European Search report received for European Patent Application No. 08022505.5, dated Apr. 25, 2012, 12 pages.

Extended European Search Report received for European Patent Application No. 10151969.2, dated Jul. 21, 2010, 6 pages.

Extended European Search Report received for European Patent Application No. 12162177.5, dated Dec. 3, 2012, 7 pages.

Extended European Search Report received for European Patent Application No. 12192450.0, dated Feb. 13, 2013, 6 pages.

Extended European Search Report received for European Patent Application No. 15166813.4, dated Aug. 31, 2015, 8 pages.

Final Office Action received for U.S. Appl. No. 11/818,498, dated Jan. 3, 2013, 17 pages.

Final Office Action received for U.S. Appl. No. 11/818,498, dated Jun. 10, 2011. 16 pages.

Final Office Action received for U.S. Appl. No. 12/206,680, dated Jan. 27, 2014, 20 pages.

Final Office Action received for U.S. Appl. No. 12/206,680, dated Jan. 5, 2012, 16 pages.

Final Office Action received for U.S. Appl. No. 12/206,680, dated May 22, 2013, 16 pages.

Final Office Action received for U.S. Appl. No. 12/238,333, dated Apr. 22, 2015, 23 pages.

Final Office Action received for U.S. Appl. No. 12/238,333, dated Aug. 12, 2013, 19 pages.

Final Office Action received for U.S. Appl. No. 12/238,342, dated Aug. 13, 2013, 14 pages.

Final Office Action received for U.S. Appl. No. 12/238,342, dated Oct. 22. 2014, 16 pages.

(56) References Cited

OTHER PUBLICATIONS

Final Office Action received for U.S. Appl. No. 12/494,173, dated Apr. 30, 2013, 7 pages.
Final Office Action received for U.S. Appl. No. 12/500,911, dated Feb. 5, 2013, 16 pages.
Final Office Action received for U.S. Appl. No. 12/545,604, dated Jul. 16, 2014, 18 pages.
Final Office Action received for U.S. Appl. No. 12/545,604, dated Jul. 19, 2013, 18 pages.
Final Office Action received for U.S. Appl. No. 12/545,754, dated Jun. 21, 2013, 6 pages.
Final Office Action received for U.S. Appl. No. 12/642,466, dated Feb. 1, 2013, 10 pages.
Final Office Action received for U.S. Appl. No. 12/642,466, dated Jan. 29, 2016, 10 pages.
Final Office Action received for U.S. Appl. No. 12/642,466, dated May 9, 2014, 13 pages.
Final Office Action received for U.S. Appl. No. 12/847,987, dated Apr. 23, 2014, 16 pages.
Final Office Action received for U.S. Appl. No. 13/448,182, dated Jun. 11, 2015, 13 pages.
Final Office Action received for U.S. Appl. No. 13/448,182, dated Oct. 22, 2014, 12 pages.
Final Office Action received for U.S. Appl. No. 13/899,391, dated Apr. 8, 2016, 10 pages.
Final Office Action received for U.S. Appl. No. 14/082,003, dated Jan. 4, 2016, 26 pages.
Final Office Action received for U.S. Appl. No. 14/082,003, dated Nov. 4, 2016, 19 pages.
Final Office Action received for U.S. Appl. No. 14/082,074, dated Nov. 12, 2015, 23 pages.
Final Office Action received for U.S. Appl. No. 14/318,157, dated Jul. 26, 2017, 10 pages.
Final Office Action received for U.S. Appl. No. 14/318,157, dated May 9, 2016, 10 pages.
Final Office Action received for U.S. Appl. No. 14/550,686, dated Aug. 21, 2017, 12 pages.
Final Office Action received for U.S. Appl. No. 14/550,686, dated Jun. 14, 2016, 11 pages.
Final Office Action received for U.S. Appl. No. 14/558,529, dated Sep. 29, 2016, 23 pages.
Final Office Action received for U.S. Appl. No. 14/645,120, dated Aug. 10, 2017, 13 pages.
Final Office Action received for U.S. Appl. No. 14/645,120, dated May 27, 2016, 13 pages.
Final Office Action received for U.S. Appl. No. 14/997,031, dated Jun. 14, 2018, 19 pages.
Final Office Action received for U.S. Appl. No. 15/009,774, dated Feb. 6, 2019, 16 pages.
Final Office Action received for U.S. Appl. No. 15/507,722, dated Sep. 13, 2019, 18 pages.
Final Office Action received for U.S. Appl. No. 15/522,737, dated Sep. 12, 2019, 15 pages.
Final Office Action received for U.S. Appl. No. 16/201,730, dated Nov. 1, 2019, 11 pages.
First Action Interview Office Action received for U.S. Appl. No. 15/686,969, dated Aug. 19, 2019, 7 pages.
Intention to Grant received for European Patent Application No. 15166813.4, dated Sep. 20, 2019, 8 pages.
International Search Report received for PCT Patent Application No. PCT/US2010/022868, dated Mar. 10, 2010, 4 pages.
International Search Report received for PCT Patent Application No. PCT/US2010/029698, dated Jan. 14, 2011, 4 pages.
International Search Report received for PCT Patent Application No. PCT/US2010/058988, dated May 2, 2011, 4 pages.
International Search Report received for PCT Patent Application No. PCT/US2013/036662, dated Aug. 6, 2013, 3 pages.
International Search Report received for PCT Patent Application No. PCT/US2014/039245, dated Sep. 24, 2014, 3 pages.
International Search Report received for PCT Patent Application No. PCT/US2014/047888, dated Jan. 29, 2015, 6 pages.
International Search Report received for PCT Patent Application No. PCT/US2014/056795, dated Dec. 12, 2014, 3 pages.
International Search Report received for PCT Patent Application No. PCT/US2015/057644, dated Jan. 8, 2016, 3 pages.
International Search Report received for PCT Patent Application No. PCT/US2016/015479, dated May 9, 2016, 3 pages.
International Search Report received for PCT Patent Application No. PCT/US2016/016011, dated May 11, 2016, 4 pages.
Lee et al., "A Multi-Touch Three Dimensional Touch-Sensitive Tablet", Proceedings of CHI: ACM Conference on Human Factors in Computing Systems, Apr. 1985, pp. 21-25.
Malik et al., "Visual Touch pad: A Two-Handed Gestural Input Device", Proceedings of the 6th International Conference on Multimodal Interfaces, State College, PA, ICMI '04, ACM, Oct. 13-15, 2004, pp. 289-296.
Non-Final Office Action received for U.S. Appl. No. 11/818,498, dated Dec. 13, 2010, 16 pages.
Non-Final Office Action received for U.S. Appl. No. 11/818,498, dated May 25, 2012, 17 pages.
Non-Final Office Action received for U.S. Appl. No. 12/206,680, dated Jun. 9, 2011, 14 pages.
Non-Final Office Action received for U.S. Appl. No. 12/206,680, dated Sep. 26, 2012, 14 pages.
Non-Final Office Action received for U.S. Appl. No. 12/206,680, dated Sep. 30, 2013, 19 pages.
Non-Final Office Action received for U.S. Appl. No. 12/238,333, dated Jan. 7, 2013, 21 pages.
Non-Final Office Action received for U.S. Appl. No. 12/238,333, dated May 3, 2012, 22 pages.
Non-Final Office Action received for U.S. Appl. No. 12/238,333, dated Sep. 18, 2014, 22 pages.
Non-Final Office Action received for U.S. Appl. No. 12/238,342, dated Feb. 15, 2013, 18 pages.
Non-Final Office Action received for U.S. Appl. No. 12/238,342, dated Mar. 12, 2014, 17 pages.
Non-Final Office Action received for U.S. Appl. No. 12/238,342, dated Mar. 9, 2012, 27 pages.
Non-Final Office Action received for U.S. Appl. No. 12/494,173, dated Nov. 28, 2012, 7 pages.
Non-Final Office Action received for U.S. Appl. No. 12/500,911, dated Jun. 7, 2012, 17 pages.
Non-Final Office Action received for U.S. Appl. No. 12/545,557, dated Jan. 3, 2014, 10 pages.
Non-Final Office Action received for U.S. Appl. No. 12/545,557, dated Nov. 23, 2012, 11 pages.
Non-Final Office Action received for U.S. Appl. No. 12/545,604, dated Dec. 19. 2013, 17 pages.
Non-Final Office Action received for U.S. Appl. No. 12/545,604, dated Jan. 7, 2013, 13 pages.
Non-Final Office Action received for U.S. Appl. No. 12/545,754, dated Jan. 2, 2014, 12 pages.
Non-Final Office Action received for U.S. Appl. No. 12/545,754, dated Oct. 5, 2012, 10 pages.
Non-Final Office Action received for U.S. Appl. No. 12/545,754, dated Sep. 10, 2013, 6 pages.
Non-Final Office Action received for U.S. Appl. No. 12/642,466, dated Aug. 28, 2012, 10 pages.
Non-Final Office Action received for U.S. Appl. No. 12/642,466, dated May 4, 2015, 10 pages.
Non-Final Office Action received for U.S. Appl. No. 12/642,466, dated Nov. 8, 2013, 13 pages.
Non-Final Office Action received for U.S. Appl. No. 12/847,987, dated Sep. 6, 2013, 16 pages.
Non-Final Office Action received for U.S. Appl. No. 13/448,182, dated Jan. 31, 2014, 18 pages.
Non-Final Office Action received for U.S. Appl. No. 13/737,779, dated Mar. 29, 2013, 10 pages.
Non-Final Office Action received for U.S. Appl. No. 13/899,391, dated Oct. 5, 2015, 11 pages.
Non-Final Office Action received for U.S. Appl. No. 14/055,717, dated Apr. 10, 2014, 11 pages.

(56) References Cited

OTHER PUBLICATIONS

Non-Final Office Action received for U.S. Appl. No. 14/082,003, dated May 25, 2016, 23 pages.
Non-Final Office Action received for U.S. Appl. No. 14/082,003, dated May 8, 2015, 26 pages.
Non-Final Office Action received for U.S. Appl. No. 14/082,074, dated Apr. 10, 2015, 24 pages.
Non-Final Office Action received for U.S. Appl. No. 14/318,157, dated Oct. 6, 2015, 8 pages.
Non-Final Office Action received for U.S. Appl. No. 14/550,686, dated Aug. 20, 2015, 11 pages.
Non-Final Office Action received for U.S. Appl. No. 14/558,529, dated Apr. 14, 2016, 21 pages.
Non-Final Office Action received for U.S. Appl. No. 14/558,529, dated Jun. 26, 2017, 6 pages.
Non-Final Office Action received for U.S. Appl. No. 14/615,186, dated Jun. 1, 2016, 9 pages.
Non-Final Office Action received for U.S. Appl. No. 14/645,120, dated Oct. 27, 2015, 9 pages.
Non-Final Office Action received for U.S. Appl. No. 14/993,017, dated Jan. 18, 2019, 35 pages.
Non-Final Office Action received for U.S. Appl. No. 15/009,774, dated Sep. 4, 2019, 18 pages.
Non-Final Office Action received for U.S. Appl. No. 15/017,463, dated May 15, 2019, 20 pages.
Non-Final Office Action received for U.S. Appl. No. 15/087,956, dated Jan. 18, 2019, 13 pages.
Non-Final Office Action received for U.S. Appl. No. 15/507,722, dated Feb. 11. 2019, 16 pages.
Non-Final Office Action received for U.S. Appl. No. 15/522,737, dated Jan. 2, 2019, 14 pages.
Non-Final Office Action received for U.S. Appl. No. 16/152,326, dated Aug. 14, 2019, 12 pages.
Non-Final Office Action received for U.S. Appl. No. 16/201,730, dated May 10, 2019, 9 pages.
Notice of Allowance received for U.S. Appl. No. 12/238,333, dated Dec. 1, 2015, 10 pages.
Notice of Allowance received for U.S. Appl. No. 12/494,173, dated Oct. 15. 2014, 8 pages.
Notice of Allowance received for U.S. Appl. No. 12/500,911, dated Aug. 19, 2013, 7 pages.
Notice of Allowance received for U.S. Appl. No. 12/545,557, dated Apr. 11. 2014, 9 pages.
Notice of Allowance received for U.S. Appl. No. 12/545,557, dated Jun. 10, 2013, 9 pages.
Notice of Allowance received for U.S. Appl. No. 12/545,604, dated Oct. 5, 2015, 9 pages.
Notice of Allowance received for U.S. Appl. No. 12/545,754, dated Aug. 21, 2014, 10 pages.
Notice of Allowance received for U.S. Appl. No. 13/448,182, dated Jan. 8, 2016, 9 pages.
Notice of Allowance received for U.S. Appl. No. 13/737,779, dated Sep. 3, 2013, 11 pages.
Notice of Allowance received for U.S. Appl. No. 14/055,717, dated Nov. 7. 2014, 7 pages.
Notice of Allowance received for U.S. Appl. No. 14/312,489, dated Mar. 16, 2015, 8 pages.
Notice of Allowance received for U.S. Appl. No. 14/318,157, dated Dec. 31, 2018, 8 pages.
Notice of Allowance received for U.S. Appl. No. 14/993,017, dated Jul. 12, 2019, 10 pages.
Notice of Allowance received for U.S. Appl. No. 15/087,956, dated Mar. 11, 2019, 11 pages.
Notice of Allowance received for U.S. Appl. No. 15/687,078, dated Apr. 3, 2019, 9 pages.
Notice of Allowance received for U.S. Appl. No. 15/691,283, dated Jun. 5, 2019, 10 pages.
Notification of Grant received for Korean Patent Application No. 10-2016-7003645, dated May 31, 2019, 3 pages (1 page of English Translation and 2 pages of Official Copy).
Notification to Grant received for Chinese Patent Ap plication No. 201610790093.1, dated Apr. 30, 2019, 4 pages (2 pages of English Translation and 2 pages of Official Copy).
Office Action received for Chinese Patent Application No. 201480081612.6, dated Jun. 4, 2019, 22 pages (11 of English Translation and 11 pages of Official Copy).
Office Action received for Chinese Patent Application No. 201580058366.7, dated May 28, 2019, 19 pages (10 pages of English Translation and 9 pages of Official Copy).
Office Action received for Chinese Patent Application No. 201680012966.4, dated Nov. 1, 2019, 19 pages (10 pages of English Translation and 9 pages of Official copy).
Preinterview First Office Action received for U.S. Appl. No. 15/686,969, dated Apr. 4, 2019, 4 pages.
Rekimoto, J., "SmartSkin: An Infrastructure for Freehand Manipulation on Interactive Surfaces", CHI 2002 Conference Proceedings, Conference on Human Factors in Computing Systems, Minneapolis, vol. 4, No. 1, Apr. 20-25, 2002, pp. 113-120.
Restriction Requirement received for U.S. Appl. No. 12/238,333, dated Mar. 8, 2012, 6 pages.
Restriction Requirement received for U.S. Appl. No. 12/494,173, dated Aug. 8, 2012, 5 pages.
Restriction Requirement received for U.S. Appl. No. 13/899,391, dated Apr. 8, 2015, 6 pages.
Restriction Requirement received for U.S. Appl. No. 15/087,956, dated Feb. 13, 2018, 8 pages.
Restriction Requirement received for U.S. Appl. No. 15/097,179, dated Sep. 28, 2017, 6 pages.
Restriction Requirement received for U.S. Appl. No. 15/691,283, dated Mar. 5, 2019, 6 pages.
Rubine, Dean H., "Combining Gestures and Direct Manipulation", CHI '92, May 3-7, 1992, pp. 659-660.
Rubine, Dean H., "The Automatic Recognition of Gestures", CMU-CS-91-202. Submitted in Partial Fulfillment of the Requirements for the Degree of Doctor of Philosophy in Computer Science at Carnegie Mellon University, Dec. 1991, 285 pages.
Search Report received for Chinese Patent Application No. 201310042816.6, dated May 18, 2015, 4 pages (2 pages of English Translation and 2 pages of Official copy).
Search Report received for Chinese Patent Application No. ZL201020108330.X, dated Dec. 14, 2011, 12 pages (English Translation only).
Supplementary European Search Report received for European Patent Application No. 14902458.0, dated Jul. 27, 2017, 4 pages.
Search Report received for Netherlands Patent Application No. 2001672, dated Apr. 29, 2009, 8 pages.
Search Report received for Taiwanese Patent Application No. 103105965, dated Nov. 12, 2015, 2 pages (1 page of English Translation and 1 page of Official copy).
Search Report received for Taiwanese Patent Application No. 103116003, dated Oct. 14, 2015, 2 pages (1 page of English Translation and 1 page of Official copy).
Search Report received for Taiwanese Patent Application No. 104115152, dated May 3, 2016, 2 pages (1 page of English Translation and 1 page of Official copy).
Westerman, Wayne, "Hand Tracking, Finger Identification, and Chordic Manipulation on a Multi-Touch Surface", A Dissertation Submitted to the Faculty of the University of Delaware in Partial Fulfillment of the Requirements for the Degree of Doctor of Philosophy in Electrical Engineering, 1999, 363 pages.
Wilson, A. D., "Robust Computer Vision-Based Detection of Pinching for One and Two-Handed Gesture Input", ACM, USIT '06, Montreux, Oct. 15-18, 2006, 4 pages.
Yang, et al., "A Noise-Immune High-Speed Readout Circuit for In-Cell Touch Screen Panels", IEEE Transactions on Circuits and Systems-I: Regular Papers vol. 60, No. 7, Jul. 2013, pp. 1800-1809.
Decision of Rejection received for Chinese Patent Application No. 201480065352.3, dated Mar. 2, 2020, 14 pages (9 pages of English Translation and 5 pages of Official Copy).
Decision to Grant received for European Patent Application No. 15166813.4, dated Feb. 6, 2020, 2 pages.
Extended European Search Report received for European Patent Application No. 18197785.1, dated Apr. 5, 2019, 8 pages.

(56) References Cited

OTHER PUBLICATIONS

Final Office Action received for U.S. Appl. No. 15/226,628, dated Mar. 28, 2018, 17 pages.
International Preliminary Report on Patentability received for PCT Patent Application No. PCT/US2017/044545, dated Feb. 7, 2019, 9 pages.
Non-Final Office Action received for U.S. Appl. No. 13/766,376, dated Jul. 31, 2015, 29 pages.
Non-Final Office Action received for U.S. Appl. No. 15/039,400, dated Nov. 24, 2017, 17 pages.
Non-Final Office Action received for U.S. Appl. No. 15/089,432, dated Jan. 24, 2018, 28 pages.
Non-Final Office Action received for U.S. Appl. No. 15/148,798, dated Oct. 30, 2017, 11 pages.
Non-Final Office Action received for U.S. Appl. No. 15/226,628, dated Aug. 11, 2017, 11 pages.
Non-Final Office Action received for U.S. Appl. No. 15/226,628, dated Aug. 27, 2018, 17 pages.
Non-Final Office Action received for U.S. Appl. No. 15/311,836, dated Dec. 15, 2017, 15 pages.
Non-Final Office Action received for U.S. Appl. No. 15/687,354, dated May 23, 2019, 18 pages.
Non-Final Office Action received for U.S. Appl. No. 16/030,654, dated Feb. 21, 2020, 15 pages.
Non-Final Office Action received for U.S. Appl. No. 16/179,565, dated Dec. 13, 2018, 9 pages.
Non-Final Office Action received for U.S. Appl. No. 16/192,664, dated Nov. 26, 2019, 9 pages.
Non-Final Office Action received for U.S. Appl. No. 16/581,721, dated Oct. 30, 2019, 10 pages.
Notice of Acceptance received for Australian Patent Application No. 2019200698, dated Feb. 12, 2020, 3 pages.
Notice of Allowance received for U.S. Appl. No. 13/766,376, dated Jan. 11, 2016, 10 pages.
Notice of Allowance received for U.S. Appl. No. 15/009,774, dated Mar. 20, 2020, 16 pages.
Notice of Allowance received for U.S. Appl. No. 15/039,400, dated Nov. 14, 2018, 2 pages.
Notice of Allowance received for U.S. Appl. No. 15/039,400, dated Oct. 12, 2018, 9 pages.
Notice of Allowance received for U.S. Appl. No. 15/089,432, dated Jul. 30, 2018, 10 pages.
Notice of Allowance received for U.S. Appl. No. 15/148,798, dated Mar. 14, 2018, 10 pages.
Notice of Allowance received for U.S. Appl. No. 15/226,628, dated Apr. 3, 2019, 6 pages.
Notice of Allowance received for U.S. Appl. No. 15/311,836, dated Jul. 5, 2018, 9 pages.
Notice of Allowance received for U.S. Appl. No. 15/507,722, dated Feb. 27, 2020, 9 pages.
Notice of Allowance received for U.S. Appl. No. 15/663,271, dated Jul. 5, 2018, 10 pages.
Notice of Allowance received for U.S. Appl. No. 15/687,354, dated Sep. 6, 2019, 12 pages.
Notice of Allowance received for U.S. Appl. No. 16/179,565, dated Jun. 6, 2019, 7 pages.
Office Action received for Australian Patent Application No. 2019200698, dated Nov. 23, 2019, 3 pages.
Office Action received for Chinese Patent Application No. 201680008313.9, dated Jul. 16, 2019, 20 pages (12 pages of English Translation and 8 pages of Official copy).
Restriction Requirement received for U.S. Appl. No. 131766,376, dated Mar. 16, 2015, 6 pages.
Restriction Requirement received for U.S. Appl. No. 15/089,432, dated Jul. 17, 2017, 5 pages.
Written Opinion received for PCT Patent Application No. PCT/US2010/022868, dated Mar. 10, 2010, 4 pages.
Examiner's Answer to Appeal Brief received for U.S. Appl. No. 11/818,498, dated Dec. 20, 2013, 17 pages.
Final Office Action received for U.S. Appl. No. 15/017,463, dated Feb. 13, 2020, 22 pages.
Final Office Action received for U.S. Appl. No. 16/152,326, dated Jan. 27, 2020, 10 pages.
Final Office Action received for U.S. Appl. No. 16/192,664, dated Apr. 16, 2020, 10 pages.
Non-Final Office Action received for U.S. Appl. No. 16/152,326, dated Jun. 29, 2020, 10 pages.
Non-Final Office Action received for U.S. Appl. No. 16/192,664, dated Jul. 30, 2020, 10 pages.
Notice of Allowance received for U.S. Appl. No. 15/009,774, dated Jul. 1, 2020, 6 pages.
Notice of Allowance received for U.S. Appl. No. 15/522,737, dated Mar. 6, 2020, 8 pages.
Notice of Allowance received for U.S. Appl. No. 15/686,969, dated Jan. 2, 2020, 8 pages.
Notice of Allowance received for U.S. Appl. No. 16/581,721, dated Apr. 22, 2020, 5 pages.
Notice of Allowance received for U.S. Appl. No. 16/581,721, dated Aug. 4, 2020, 5 pages.
Notice of Allowance received for U.S. Appl. No. 16/030,654, dated Jun. 16, 2020, 8 pages.
Patent Board Decision received for U.S. Appl. No. 11/818,498, dated Nov. 2, 2016, 8 pages.
Search Report received for Chinese Patent Application No. 201680008313.9, dated Jul. 5, 2019, 4 pages (2 pages English Translation and 2 pages of Official copy).
Supplemental Notice of Allowance received for U.S. Appl. No. 15/686,969, dated Feb. 21, 2020, 2 pages.

* cited by examiner

PANEL BOOTSTRAPING ARCHITECTURES FOR IN-CELL SELF-CAPACITANCE

CROSS-REFERENCE TO RELATED APPLICATIONS

This application is a National Phase application under 35 U.S.C. § 371 of International Application No. PCT/US2014/039245, filed May 22, 2014, the contents of which is hereby incorporated by reference in its entirety for all intended purposes.

FIELD OF THE DISCLOSURE

This relates generally to touch sensor panels that are integrated with displays, and more particularly, to integrated touch screens in which a self-capacitance touch sensor is utilized to detect the presence of an object in contact with or in close proximity to a touch sensor panel.

BACKGROUND OF THE DISCLOSURE

Many types of input devices are presently available for performing operations in a computing system, such as buttons or keys, mice, trackballs, joysticks, touch sensor panels, touch screens and the like. Touch screens, in particular, are becoming increasingly popular because of their ease and versatility of operation as well as their declining price. Touch screens can include a touch sensor panel, which can be a clear panel with a touch-sensitive surface, and a display device such as a liquid crystal display (LCD) that can be positioned partially or fully behind the panel so that the touch-sensitive surface can cover at least a portion of the viewable area of the display device. Touch screens can allow a user to perform various functions by touching the touch sensor panel using a finger, stylus or other object at a location often dictated by a user interface (UI) being displayed by the display device. In general, touch screens can recognize a touch and the position of the touch on the touch sensor panel, and the computing system can then interpret the touch in accordance with the display appearing at the time of the touch, and thereafter can perform one or more actions based on the touch. In the case of some touch sensing systems, a physical touch on the display is not needed to detect a touch. For example, in some capacitive-type touch sensing systems, fringing electrical fields used to detect touch can extend beyond the surface of the display, and objects approaching near the surface may be detected near the surface without actually touching the surface.

Capacitive touch sensor panels can be formed by a matrix of substantially transparent conductive plates made of materials such as Indium Tin Oxide (ITO). It is due in part to their substantial transparency that capacitive touch sensor panels can be overlaid on a display to form a touch screen, as described above. Some touch screens can be formed by partially integrating touch sensing circuitry into a display pixel stackup (i.e., the stacked material layers forming the display pixels).

SUMMARY OF THE DISCLOSURE

Some capacitive touch sensor panels can be formed by a matrix of substantially transparent conductive plates made of materials such as Indium Tin Oxide (ITO), and some touch screens can be formed by partially integrating touch sensing circuitry into a display pixel stackup (i.e., the stacked material layers forming the display pixels). Touch events can be sensed on the above touch screens by detecting changes in the self-capacitance of the above conductive plates. However, in some examples, one or more capacitances resulting from the integration of touch sensing circuitry into display pixel stackups can cause offsets in the self-capacitance measurements that can reduce the dynamic range of corresponding sensing circuits, and can make touch detection difficult. The examples of the disclosure provide various techniques for reducing the offset effects of such capacitances.

DETAILED DESCRIPTION

In the following description of examples, reference is made to the accompanying drawings which form a part hereof, and in which it is shown by way of illustration specific examples that can be practiced. It is to be understood that other examples can be used and structural changes can be made without departing from the scope of the disclosed examples.

Some capacitive touch sensor panels can be formed by a matrix of substantially transparent conductive plates made of materials such as Indium Tin Oxide (ITO), and some touch screens can be formed by partially integrating touch sensing circuitry into a display pixel stackup (i.e., the stacked material layers forming the display pixels). Additionally, some capacitive touch sensor panels can be formed by rows and columns of substantially transparent conductive lines made of materials such as ITO, and can similarly form touch screens with touch sensing circuitry partially integrated into a display pixel stackup. Touch events can be sensed on the above touch screens by detecting changes in the self-capacitance of the above conductive plates and/or lines. However, in some examples, one or more capacitances resulting from the integration of touch sensing circuitry into display pixel stackups can cause offsets in the self-capacitance measurements that can reduce the dynamic range of corresponding sensing circuits, and can make touch detection difficult. The examples of the disclosure provide various techniques for reducing the offset effects of such capacitances.

Figure 1C:
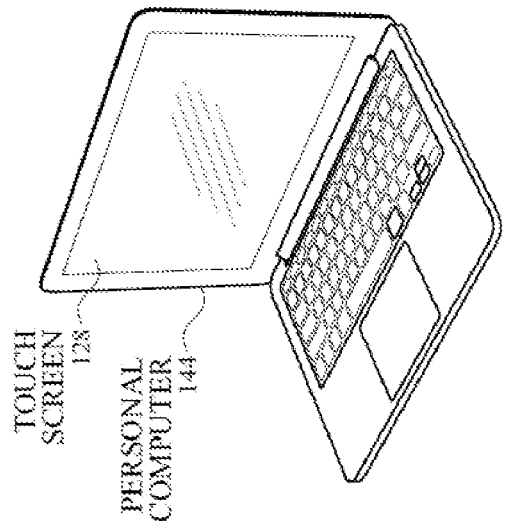
FIGS. 1A-1C illustrate an example mobile telephone, an example media player, and an example portable computing device that each include an exemplary touch screen according to examples of the disclosure.
Figure 1B:
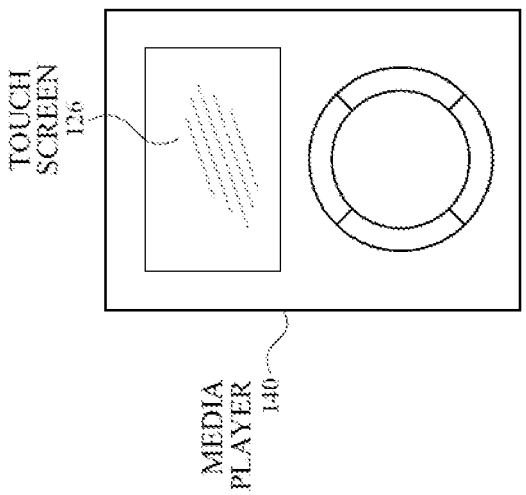
Figure 1A:
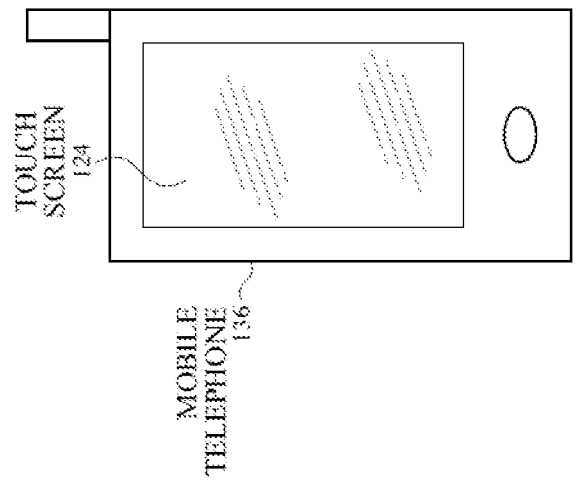

FIGS. 1A-1C show example systems in which a touch screen according to examples of the disclosure may be implemented. FIG. 1A illustrates an example mobile telephone 136 that includes a touch screen 124. FIG. 1B illustrates an example digital media player 140 that includes a touch screen 126. FIG. 1C illustrates an example portable computing device 144 that includes a touch screen 128. Touch screens 124, 126, and 128 can be based on self-capacitance. A self-capacitance based touch system can include small plates of conductive material that can be called a touch pixel or a touch pixel electrode. During operation, the touch pixel can be stimulated with an AC waveform and the self-capacitance of the touch pixel can be measured. As an object approaches the touch pixel, the self-capacitance of the touch pixel can change. This change in the self-capacitance of the touch pixel can be detected and measured by the touch sensing system to determine the positions of multiple objects when they touch, or come in proximity to, the touch screen. In some examples, the electrodes of a self-capacitance based touch system can be formed from rows and columns of conductive material, and changes in the self-capacitance of the rows and columns can be detected, similar to above. In some examples, a touch screen can be multi-touch, single touch, projection scan, full-imaging multi-touch, capacitive touch, etc.

Figure 2:
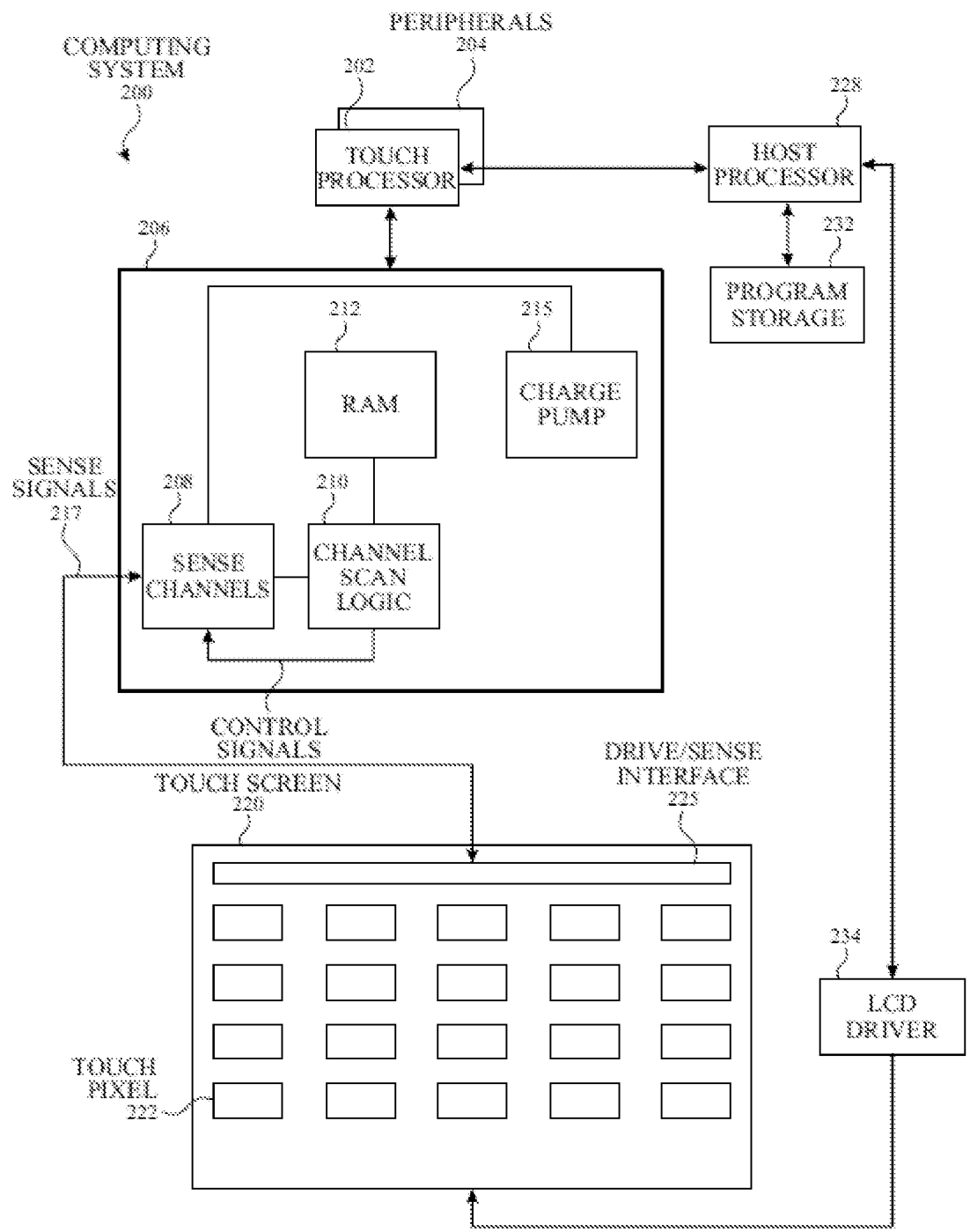
FIG. 2 is a block diagram of an exemplary computing system that illustrates one implementation of an example touch screen according to examples of the disclosure.

FIG. 2 is a block diagram of an example computing system 200 that illustrates one implementation of an example touch screen 220 according to examples of the disclosure. Computing system 200 can be included in, for example, mobile telephone 136, digital media player 140, portable computing device 144, or any mobile or non-mobile computing device that includes a touch screen, including a wearable device. Computing system 200 can include a touch sensing system including one or more touch processors 202, peripherals 204, a touch controller 206, and touch sensing circuitry (described in more detail below). Peripherals 204 can include, but are not limited to, random access memory (RAM) or other types of memory or storage, watchdog timers and the like. Touch controller 206 can include, but is not limited to, one or more sense channels 208 and channel scan logic 210. Channel scan logic 210 can access RAM 212, autonomously read data from sense channels 208 and provide control for the sense channels. In addition, channel scan logic 210 can control sense channels 208 to generate stimulation signals at various frequencies and phases that can be selectively applied to the touch pixels of touch screen 220, as described in more detail below. In some examples, touch controller 206, touch processor 202 and peripherals 204 can be integrated into a single application specific integrated circuit (ASIC), and in some examples can be integrated with touch screen 220 itself.

Touch screen 220 can include touch sensing circuitry that can include a capacitive sensing medium having a plurality of touch pixels 222. It is understood that while touch screen 220 is described here as including touch pixels 222, the touch screen can similarly include rows and columns of conductive material (e.g., electrodes 302 in FIG. 3); the operation and functions of such a touch screen would be similar to those described here. Touch pixels 222 can be coupled to sense channels 208 in touch controller 206, can be driven by stimulation signals from the sense channels through drive/sense interface 225, and can be sensed by the sense channels through the drive/sense interface as well, as described above. Labeling the conductive plates used to detect touch (i.e., touch pixels 222) as "touch pixels" can be particularly useful when touch screen 220 is viewed as capturing an "image" of touch. In other words, after touch controller 206 has determined an amount of touch detected at each touch pixel 222 in touch screen 220, the pattern of touch pixels in the touch screen at which a touch occurred can be thought of as an "image" of touch (e.g., a pattern of fingers touching the touch screen).

Computing system 200 can also include a host processor 228 for receiving outputs from touch processor 202 and performing actions based on the outputs. For example, host processor 228 can be connected to program storage 232 and a display controller, such as an LCD driver 234. The LCD driver 234 can provide voltages on select (gate) lines to each pixel transistor and can provide data signals along data lines to these same transistors to control the pixel display image as described in more detail below. Host processor 228 can use LCD driver 234 to generate an image on touch screen 220, such as an image of a user interface (UI), and can use touch processor 202 and touch controller 206 to detect a touch on or near touch screen 220. The touch input can be used by computer programs stored in program storage 232 to perform actions that can include, but are not limited to, moving an object such as a cursor or pointer, scrolling or panning, adjusting control settings, opening a file or document, viewing a menu, making a selection, executing instructions, operating a peripheral device connected to the host device, answering a telephone call, placing a telephone call, terminating a telephone call, changing the volume or audio settings, storing information related to telephone communications such as addresses, frequently dialed numbers, received calls, missed calls, logging onto a computer or a computer network, permitting authorized individuals access to restricted areas of the computer or computer network, loading a user profile associated with a user's preferred arrangement of the computer desktop, permitting access to web content, launching a particular program, encrypting or decoding a message, and/or the like. Host processor 228 can also perform additional functions that may not be related to touch processing.

Note that one or more of the functions described above, including the configuration of switches, can be performed by firmware stored in memory (e.g., one of the peripherals 204 in FIG. 2) and executed by touch processor 202, or stored in program storage 232 and executed by host processor 228. The firmware can also be stored and/or transported within any non-transitory computer-readable storage medium for use by or in connection with an instruction execution system, apparatus, or device, such as a computer-based system, processor-containing system, or other system that can fetch the instructions from the instruction execution system, apparatus, or device and execute the instructions. In the context of this document, a "non-transitory computer-readable storage medium" can be any medium (excluding signals) that can contain or store the program for use by or in connection with the instruction execution system, apparatus, or device. The computer-readable storage medium can include, but is not limited to, an electronic, magnetic, optical, electromagnetic, infrared, or semiconductor system, apparatus or device, a portable computer diskette (magnetic), a random access memory (RAM) (magnetic), a read-only memory (ROM) (magnetic), an erasable programmable read-only memory (EPROM) (magnetic), a portable optical disc such a CD, CD-R, CD-RW, DVD, DVD-R, or DVD-RW, or flash memory such as compact flash cards, secured digital cards, USB memory devices, memory sticks, and the like.

The firmware can also be propagated within any transport medium for use by or in connection with an instruction execution system, apparatus, or device, such as a computer-based system, processor-containing system, or other system that can fetch the instructions from the instruction execution system, apparatus, or device and execute the instructions. In the context of this document, a "transport medium" can be any medium that can communicate, propagate or transport the program for use by or in connection with the instruction execution system, apparatus, or device. The transport medium can include, but is not limited to, an electronic, magnetic, optical, electromagnetic or infrared wired or wireless propagation medium.

Figure 3:
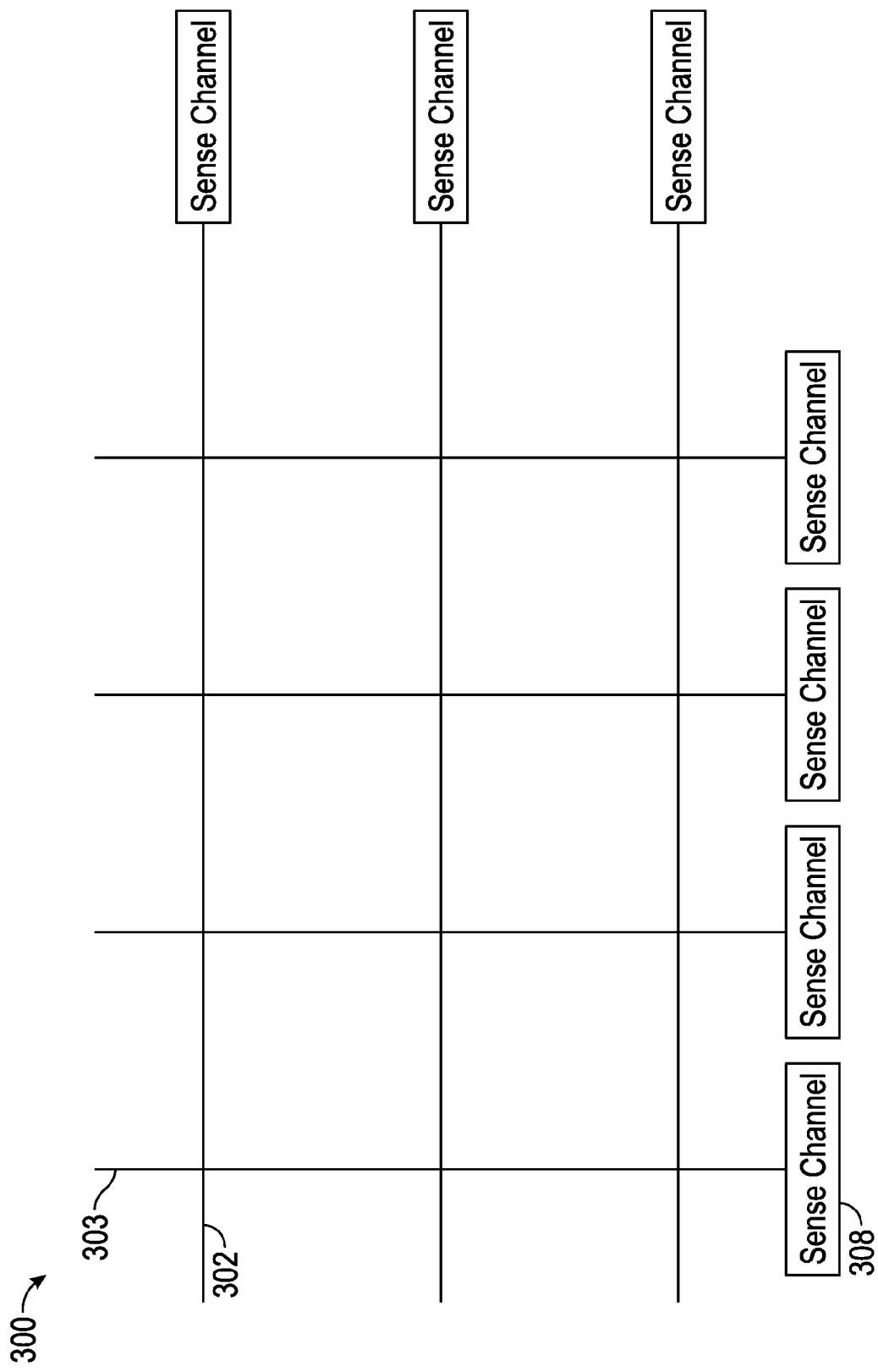
FIG. 3 illustrates an exemplary self-capacitance touch sensor panel having row and column electrodes, and sense channels, according to examples of the disclosure.

FIG. 3 illustrates an exemplary self-capacitance touch sensor panel 300 having row 302 and column 303 electrodes, and sense channels 308, according to examples of the disclosure. Similar to touch pixels 222 described above, row 302 and column 303 electrodes can be coupled to sense channels 308, which can be included in a touch controller such as touch controller 206. In some examples, sense channels 308 can correspond to sense channels 208 in FIG. 2. Row 302 and column 303 electrodes can each have a self-capacitance to ground. The operation of touch sensor panel 300 can be similar to the operation of touch screen 220 described above—row 302 and column 303 electrodes can be driven by stimulation signals from sense channels 308, and the self-capacitance of the row and column electrodes can be sensed by the sense channels. Specifically, when an object touches or is in close proximity to row 302 and/or column 303 electrodes, an additional capacitance can be formed between the respective electrodes and ground through the object, which can increase the self-capacitance of the respective electrodes. This change in the self-capacitance of the row 302 and/or column 303 electrodes can be detected by sense channels 308. An "image" of touch can thus be captured.

Figure 4:
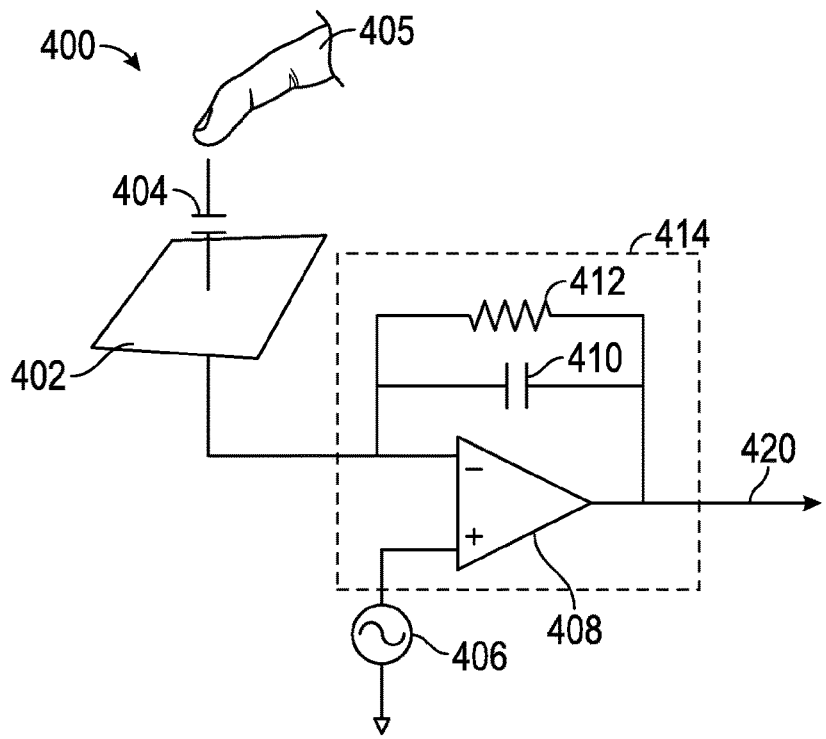
FIG. 4 illustrates an exemplary touch sensor circuit corresponding to a self-capacitance touch pixel electrode and sensing according to examples of the disclosure.

FIG. 4 illustrates an exemplary touch sensor circuit 400 corresponding to a self-capacitance touch pixel electrode 402 and sensing circuit 414 according to examples of the disclosure. Touch pixel electrode 402 can correspond to touch pixel 222. Touch pixel electrode 402 can have an inherent self-capacitance to ground associated with it, and also an additional self-capacitance to ground that is formed when an object, such as finger 405, is in proximity to or touching the electrode. The total self-capacitance to ground of touch pixel electrode 402 can be illustrated as capacitance 404. Touch pixel electrode 402 can be coupled to sensing circuit 414. Sensing circuit 414 can include an operational amplifier 408, feedback resistor 412, feedback capacitor 410 and an input voltage source 406, although other configurations can be employed. For example, feedback resistor 412 can be replaced by a switched capacitor resistor in order to minimize any parasitic capacitance effect caused by a variable feedback resistor. Touch pixel electrode 402 can be coupled to the inverting input of operational amplifier 408. An AC voltage source 406 (Vac) can be coupled to the non-inverting input of operational amplifier 408. Touch sensor circuit 400 can be configured to sense changes in the total self-capacitance 404 of the touch pixel electrode 402 induced by a finger or object either touching or in proximity to the touch sensor panel. Output 420 can be used by a processor to determine the presence of a proximity or touch event, or the output can be inputted into a discrete logic network to determine the presence of a touch or proximity event. It is understood that one or more of the operations described above with reference to touch pixel electrode 402 can similarly be performed with respect to a row/column electrode such as row 302 and column 303 electrodes in FIG. 3.

Figure 5:
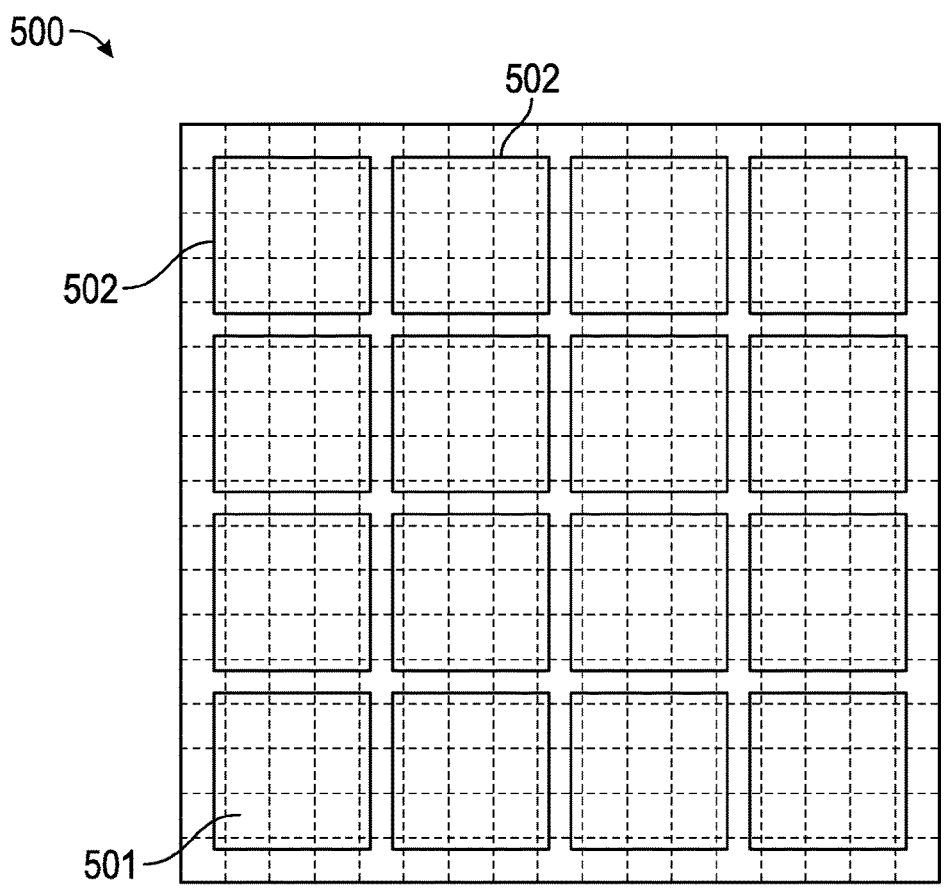
FIG. 5 illustrates an example configuration in which common electrodes can form portions of the touch sensing circuitry of a touch sensing system.

Referring back to FIG. 2, in some examples, touch screen 220 can be an integrated touch screen in which touch sensing circuit elements of the touch sensing system can be integrated into the display pixel stackups of a display. The circuit elements in touch screen 220 can include, for example, elements that can exist in LCD or other displays, such as one or more pixel transistors (e.g., thin film transistors (TFTs)), gate lines, data lines, pixel electrodes and common electrodes. In any given display pixel, a voltage between a pixel electrode and a common electrode can control a luminance of the display pixel. The voltage on the pixel electrode can be supplied by a data line through a pixel transistor, which can be controlled by a gate line. It is noted that circuit elements are not limited to whole circuit components, such as a whole capacitor, a whole transistor, etc., but can include portions of circuitry, such as only one of the two plates of a parallel plate capacitor. FIG. 5 illustrates an example configuration in which common electrodes 502 can form portions of the touch sensing circuitry of a touch sensing system—in some examples of this disclosure, the common electrodes can form touch pixels used to detect an image of touch on touch screen 500, as described above. Each common electrode 502 (i.e., touch pixel region) can include a plurality of display pixels 501, and each display pixel 501 can include a portion of a common electrode 502, which can be a circuit element of the display system circuitry in the pixel stackup (i.e., the stacked material layers forming the display pixels) of the display pixels of some types of LCD or other displays that can operate as part of the display system to display an image.

In the example shown in FIG. 5, each common electrode 502 can serve as a multi-function circuit element that can operate as display circuitry of the display system of touch screen 500 and can also operate as touch sensing circuitry of the touch sensing system. In this example, each common electrode 502 can operate as a common electrode of the display circuitry of the touch screen 500, as described above, and can also operate as touch sensing circuitry of the touch screen. For example, a common electrode 502 can operate as a capacitive part of a touch pixel of the touch sensing circuitry during the touch sensing phase. Other circuit elements of touch screen 500 can form part of the touch sensing circuitry by, for example, switching electrical connections, etc. More specifically, in some examples, during the touch sensing phase, a gate line can be connected to a power supply, such as a charge pump, that can apply a voltage to maintain TFTs in display pixels included in a touch pixel in an "off" state. Stimulation signals can be applied to common electrode 502. Changes in the total self-capacitance of common electrode 502 can be sensed through an operational amplifier, as previously discussed. The change in the total self-capacitance of common electrode 502 can depend on the proximity of a touch object, such as finger 405, to the common electrode. In this way, the measured change in total self-capacitance of common electrode 502 can provide an indication of touch on or near the touch screen.

In general, each of the touch sensing circuit elements may be either a multi-function circuit element that can form part of the touch sensing circuitry and can perform one or more other functions, such as forming part of the display circuitry, or may be a single-function circuit element that can operate as touch sensing circuitry only. Similarly, each of the display circuit elements may be either a multi-function circuit element that can operate as display circuitry and perform one or more other functions, such as operating as touch sensing circuitry, or may be a single-function circuit element that can operate as display circuitry only. Therefore, in some examples, some of the circuit elements in the display pixel stackups can be multi-function circuit elements and other circuit elements may be single-function circuit elements. In other examples, all of the circuit elements of the display pixel stackups may be single-function circuit elements.

In addition, although examples herein may describe the display circuitry as operating during a display phase, and describe the touch sensing circuitry as operating during a touch sensing phase, it should be understood that a display phase and a touch sensing phase may be operated at the same time, e.g., partially or completely overlap, or the display phase and touch sensing phase may operate at different times. Also, although examples herein describe certain circuit elements as being multi-function and other circuit elements as being single-function, it should be understood that the circuit elements are not limited to the particular functionality in other examples. In other words, a circuit element that is described in one example herein as a single-function circuit element may be configured as a multi-function circuit element in other examples, and vice versa.

The common electrodes 502 (i.e., touch pixels) and display pixels 501 of FIG. 5 are shown as rectangular or square regions on touch screen 500. However, it is understood that the common electrodes 502 and display pixels 501 are not limited to the shapes, orientations, and positions shown, but can include any suitable configurations according to examples of the disclosure.

Figure 6:
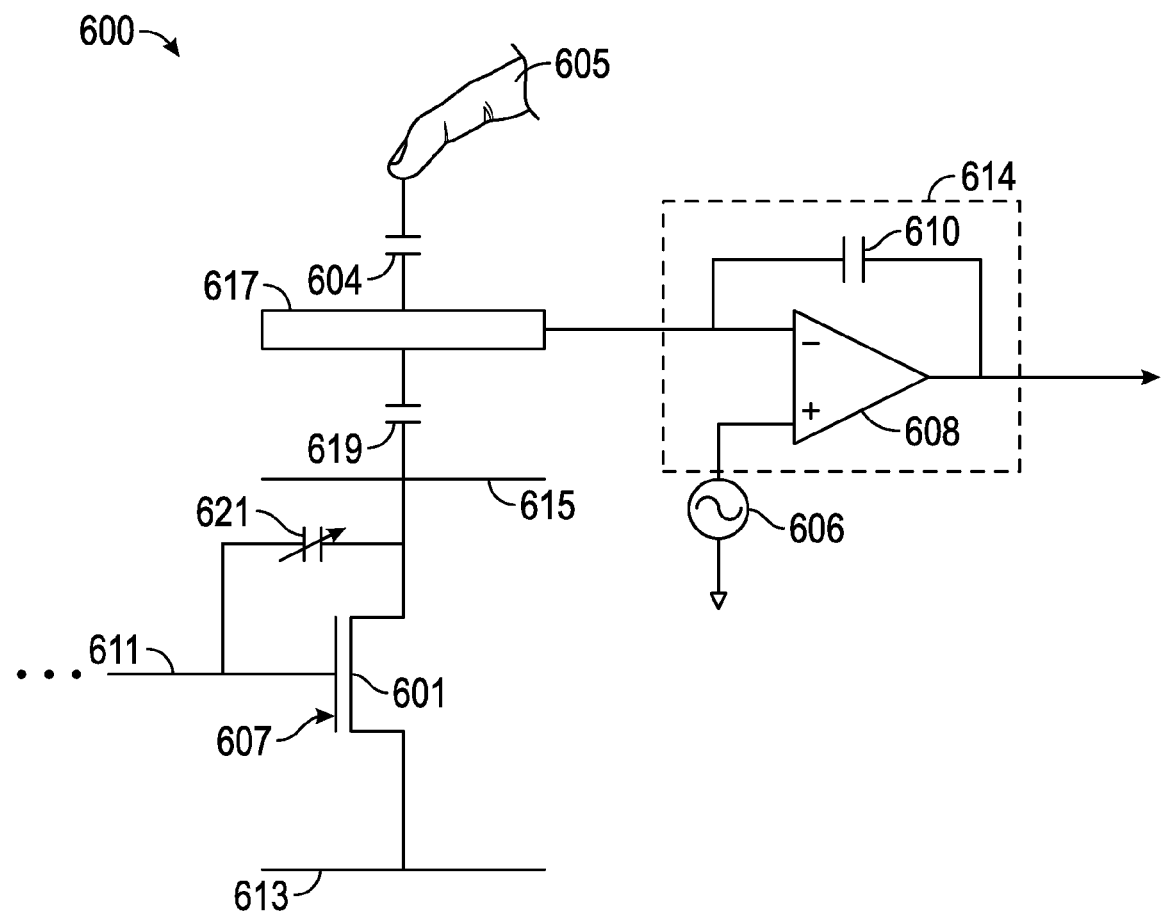
FIG. 6 shows a partial circuit diagram of some of the touch sensing circuitry within a display pixel of an example touch screen according to examples of the disclosure.

FIG. 6 shows a partial circuit diagram 600 of some of the touch sensing circuitry within a display pixel of an example touch screen according to examples of the disclosure. For the sake of clarity, only one display pixel structure is shown. However, it is understood that other display pixels of the touch screen can include the same or similar touch sensing circuitry as described below for display pixel 601. Thus, the description of the operation of display pixel 601 can be considered a description of the operation of the touch panel, in general.

Display pixel 601 can include TFT 607, gate line 611, data line 613, pixel electrode 615, and common electrode 617. Common electrode 617 can correspond to any one of touch pixels 222 in FIG. 2, row 302 or column 303 electrodes in FIG. 3, touch pixel electrodes 402 in FIG. 4 and/or common electrodes 502 in FIG. 5. Gate line 611 can supply one or more voltages to the gate terminal of TFT 607 to control the operational state of the TFT (e.g., "on" or "off"), and data line 613 can supply one or more voltages for setting the voltage on pixel electrode 615. In some examples, gate line 611 can be shared by more than one display pixel (i.e., the gate line can be connected to the gate terminal of more than one display TFT), though a single display pixel is shown for simplicity. Storage capacitance 619 can exist between common electrode 617 and pixel electrode 615, and can store a charge—set by the voltage difference between data line 613 and common electrode 617—for controlling a luminance of display pixel 601. In some examples, offset capacitance 621 (or "parasitic capacitance") can exist between the drain terminal of TFT 607 and the gate terminal of the TFT. Offset capacitance 621 can vary based on the voltage difference between gate line 611 and pixel electrode 615, and can include capacitances such as the gate-to-drain capacitance of TFT 607 and/or other capacitances due to the layout of various components of the touch screen. Operational amplifier 608 can be configured to sense changes in the total self-capacitance of common electrode 617, as described above, to determine the presence of a proximity or touch event at the common electrode. Although display pixel 601 has been described as including a single TFT (i.e., TFT 607), in some examples, the display pixel may include more than a single TFT. For example, display pixel 601 can include two TFTs connected in series, the gate terminals of which both can be connected to gate line 611. The operation of such display pixels can be substantially the same as the operation of the display pixel of FIG. 6. For ease of description, the examples of the disclosure will be described with reference to the display pixel configuration of FIG. 6, although it is understood that the scope of the disclosure is not so limited.

During a touch sensing phase of the touch screen, gate line 611 can supply a voltage to the gate of TFT 607 for turning "off" the TFT. Operational amplifier 608 can sense changes in the total self-capacitance of common electrode 617. As described above, this total self-capacitance can include a touch capacitance 604 due to an object, such as finger 605, being in proximity to or touching common electrode 617, as well as any other capacitance that may be seen at the common electrode. In some examples, the total self-capacitance seen at common electrode 617 can include storage capacitance 619 in series with offset capacitance 621. In some examples, storage capacitance 619 can be much larger than offset capacitance 621, and can thus dominate the non-touch-related total capacitance seen at common electrode 617. As such, the total self-capacitance seen at common electrode 617 can be approximately a combination of touch capacitance 604 and offset capacitance 621.

Figure 7:
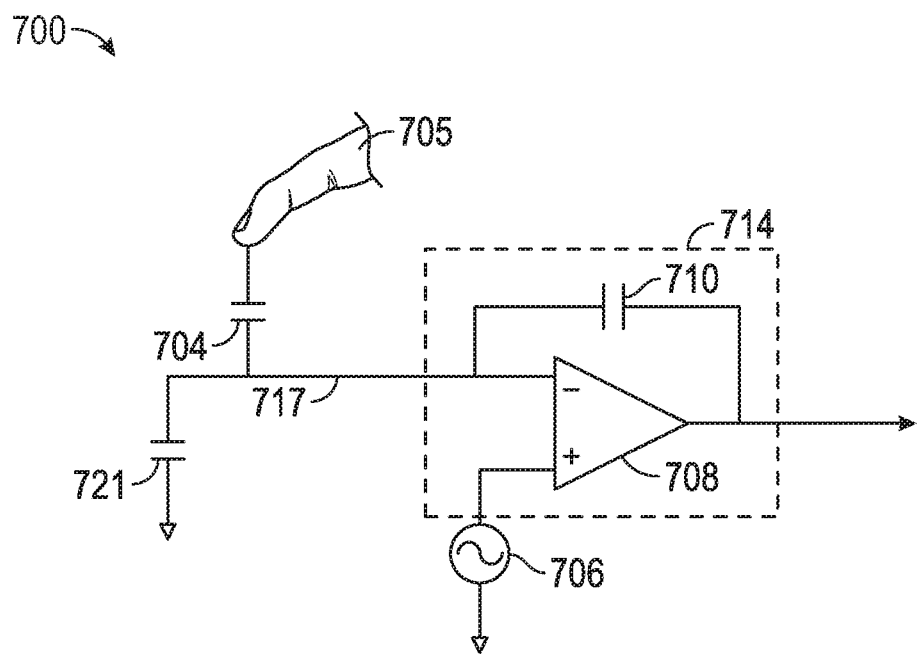
FIG. 7 illustrates an exemplary electrical circuit corresponding to a self-capacitance touch sensor electrode and sensing circuit according to examples of the disclosure.

FIG. 7 illustrates an exemplary electrical circuit 700 corresponding to a self-capacitance touch sensor electrode 717 and sensing circuit 714 according to examples of the disclosure. As discussed above, in some examples, storage capacitance 619 can be much larger than offset capacitance 621. Thus, the total self-capacitance seen at common electrode 617 can be approximated as a combination of touch capacitance 604 and offset capacitance 621. Ignoring touch capacitance 704, the gain of operational amplifier in the configuration illustrated can be expressed as:

$$A=1+C_{gp}/C_{fb} \qquad (1)$$

where A can represent the gain, $C_{fb}$ can correspond to feedback capacitance 710, and $C_{gp}$ can correspond to offset capacitance 721. In some examples, offset capacitance 721 can be on the order of nanofarads (~1 nF, in some examples), and feedback capacitance 710 can be on the order of picofarads (~10 pF, in some examples). In such cases, the gain of operational amplifier 708 due only to offset capacitance 721 can be approximately 101. In other words, an input voltage of 1V provided by AC voltage source 706 at the non-inverting input of operational amplifier 708 can result in an output voltage of 101V at the output of the operational amplifier. With such a large offset due simply to offset capacitance 721, it can be difficult to detect changes in the output voltage of operational amplifier 708 resulting from changes in touch capacitance 704, and thus it can be difficult to detect touch and/or proximity events. Additionally, the dynamic range of sensing circuit 714 can be significantly reduced due to the offset effect, and in some examples may render the sensing circuit inoperable.

Figure 8:
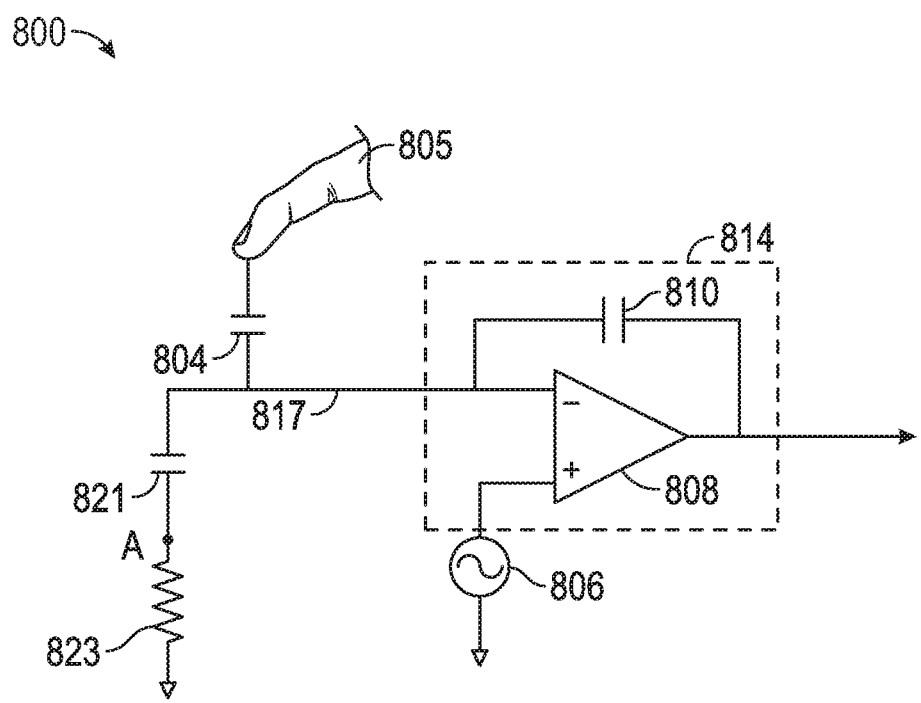
FIG. 8 illustrates an exemplary electrical circuit corresponding to a self-capacitance touch sensor electrode and sensing circuit according to examples of the disclosure.

In some examples, in order to reduce the effect of offset capacitance 621 in FIG. 6 on the output voltage of operational amplifier 608, a resistor with a large AC impedance can be added to the end of gate line 611 so that the gate line can be effectively floating. FIG. 8 illustrates an exemplary electrical circuit 800 corresponding to a self-capacitance touch sensor electrode 817 and sensing circuit 814 according to examples of the disclosure. Circuit 800 can be substantially that of FIG. 7; however, resistor 823 can be added between offset capacitance 821 and ground. Resistor 823 in circuit 800 can correspond to a resistor added somewhere on gate line 611 in FIG. 6; in some examples, the resistor can be added to the end of the gate line. The end of gate line 611 can be a portion of the gate line that can exist outside of a portion of the gate line that can include all connections between the gate line and the gate terminals of the display pixels to which the gate line is connected. In some examples, the end of gate line 611 can be in a border region (i.e., non-visible region) of the touch screen of the disclosure, and resistor 823 can be added to the gate line in the border region of the touch screen. Resistor 823 can have a sufficiently large AC impedance (or resistance) such that the terminal of offset capacitance 821 coupled to resistor 823 (i.e., node A) can be effectively floating with respect to AC signals (i.e., node A can be a high impedance node, an open circuit node, and/or decoupled from ground). However, the DC voltage at node A (i.e., the gate line) can still be controlled for proper display pixel operation, as described above. If node A is effectively floating, the voltage at node A can effectively follow (or shadow) the voltage at touch sensor electrode 817. As such, current flow into offset capacitance 821 can be virtually eliminated, and the effect of offset capacitance 821 on the total self-capacitance seen at touch sensor electrode 817 can be substantially reduced. As a result, changes in touch capacitance 804, and the effect of the touch capacitance on the output voltage of operational amplifier 808, can be more readily detected, and thus touch and/or proximity events can be more easily sensed.

Figure 9:
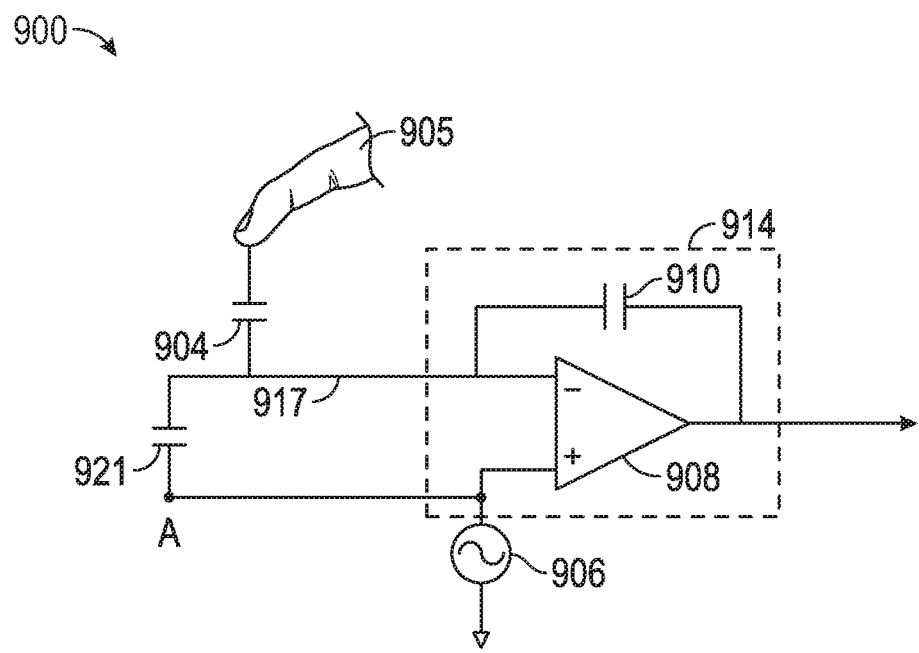
FIG. 9 illustrates an exemplary electrical circuit corresponding to a self-capacitance touch sensor electrode and sensing circuit according to examples of the disclosure.
Figure 10:
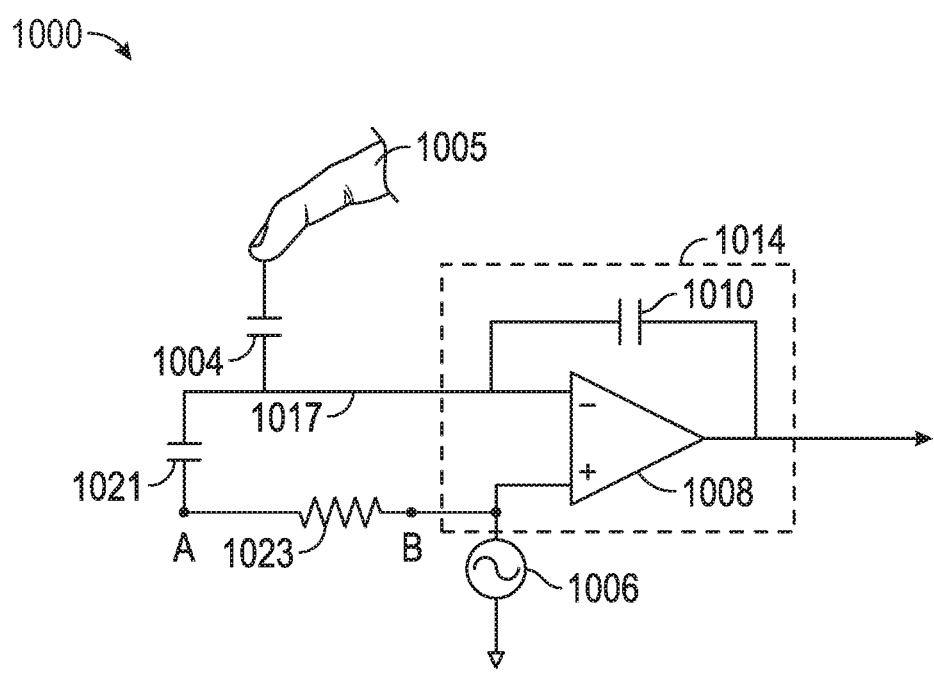
FIG. 10 illustrates an exemplary electrical circuit corresponding to a self-capacitance touch sensor electrode and sensing circuit according to examples of the disclosure.

In some examples, the effect of offset capacitance 621 can be reduced as a result of circuitry—in or coupled to the touch screen—that is configured to apply substantially similar voltage signals at gate line 611 and common electrode 617, as will be described with reference to FIGS. 9-10. In some examples, the effect of offset capacitance 621 can be reduced by driving gate line 611 in FIG. 6 with the same AC voltage as is used to drive the non-inverting input of operational amplifier 608. FIG. 9 illustrates an exemplary electrical circuit 900 corresponding to a self-capacitance touch sensor electrode 917 and sensing circuit 914 according to examples of the disclosure. Circuit 900 can be substantially that of FIG. 7, except that node A of offset capacitance 921, instead of being grounded, can be driven by the same AC signal as is driving the non-inverting input of operational amplifier 908. Such a configuration can be the result of driving gate line 611 of FIG. 6 with AC voltage source 606, for example. In some examples, gate line 611 can be driven with AC voltage source 606 on top of any DC voltage that may be applied to the gate line to allow for proper touch screen operation, as described in this disclosure. In such an arrangement, the voltage at common electrode 917 can be virtually the same as the voltage provided by AC voltage source 906 (and the voltage at the non-inverting input of operational amplifier 908) due to the operational characteristics of operational amplifier 908. The voltage at node A can also be virtually the same as the voltage provided by AC voltage source 906 because node A can be directly coupled to the AC voltage source. Thus, the voltage and/or changes in the voltage across offset capacitance 921 can be effectively zero, and current flow into the offset capacitance can be virtually eliminated. As a result, similar to the discussion above with respect to FIG. 8, the effect of offset capacitance 921 on the total self-capacitance seen at touch sensor electrode 917 can be substantially reduced. As such, changes in touch capacitance 904, and the effect of the touch capacitance on the output voltage of operational amplifier 908, can be more readily detected, and thus touch and/or proximity events can be more easily sensed. In some examples, node A can be driven by AC voltage source 906 at all times, and in other examples, node A can be driven by the AC voltage source only during certain times, such as during the touch sensing phase of the touch screen of the disclosure.

In some examples, a combination of adding a high AC impedance resistor to gate line 611 of FIG. 6, and driving the gate line with the same AC voltage source as is driving the non-inverting input of operational amplifier 608, can be used to reduce the effect of offset capacitance 621 on the output voltage of the operational amplifier. FIG. 10 illustrates an exemplary electrical circuit 1000 corresponding to a self-capacitance touch sensor electrode 1017 and sensing circuit 1014 according to examples of the disclosure. Circuit 1000 can be substantially that of FIG. 7, except that resistor 1023 can be coupled to node A of offset capacitance 1021, and node B of the resistor can be driven by AC voltage source 1006, which can also drive the non-inverting input of operational amplifier 1008. The configuration of circuit 1000 can correspond to adding resistor 1023 to gate line 611 in FIG. 6, as described above, and driving the end of the gate line with AC voltage source 606, also as described above. Such a configuration can reduce the effect of offset capacitance 1021 on the output voltage of operational amplifier 1008 in two ways, as discussed above: 1) resistor 1023 can have a sufficiently large AC impedance so as to contribute to the effect of making node A virtually floating with respect to AC signals, and 2) driving node B with AC voltage source 1006 can further contribute to the voltage at node A following the voltage at touch sensor electrode 1017. Together, these effects can contribute to virtually eliminating the voltage and/or changes in the voltage across offset capacitance 1021. Additionally, adding resistor 1023 can help increase the AC load that AC voltage source 1006 sees when driving offset capacitance 1021 and operational amplifier 1008, and thus can make it easier for the AC voltage source to drive the various components to which it is connected. As a result of the above, the effect of offset capacitance 1021 on the total self-capacitance seen at touch sensor electrode 1017 can be substantially reduced. As such, changes in touch capacitance 1004, and the effect of the touch capacitance on the output voltage of operational amplifier 1008, can be more readily detected, and thus touch and/or proximity events can be more easily sensed. In some examples, node B can be driven by AC voltage source 1006 at all times, and in other examples, node B can be driven by the AC voltage source only during certain times, such as during the touch sensing phase of the touch screen of the disclosure.

Thus, the examples of the disclosure provide one or more configurations for reducing the effects of offset capacitances on the dynamic range of sensing circuitry in the touch screens of the disclosure, making it easier to detect touch and/or proximity events at the touch screen.

Therefore, according to the above, some examples of the disclosure are directed a self-capacitance touch screen, the touch screen comprising: a plurality of display pixels, a first display pixel of the plurality of display pixels including a first touch electrode of a plurality of touch electrodes; and a gate line coupled to the first display pixel, wherein the gate line is configured such that a voltage at the gate line substantially follows a voltage at the first touch electrode. Additionally or alternatively to one or more of the examples disclosed above, in some examples, the touch screen is configured to enable an AC voltage to be present at both the gate line and the first touch electrode. Additionally or alternatively to one or more of the examples disclosed above, in some examples, the gate line is coupled to a resistor, the resistor being configured to decouple the gate line from ground. Additionally or alternatively to one or more of the examples disclosed above, in some examples, the resistor is in a border region of the touch screen. Additionally or alternatively to one or more of the examples disclosed above, in some examples, the resistor is coupled to an AC voltage source. Additionally or alternatively to one or more of the examples disclosed above, in some examples, the AC voltage source is coupled to sense circuitry, and the sense circuitry is coupled to the first touch electrode. Additionally or alternatively to one or more of the examples disclosed above, in some examples, the gate line is coupled to an AC voltage source. Additionally or alternatively to one or more of the examples disclosed above, in some examples, the touch screen further comprises sense circuitry coupled to the first touch electrode, and the AC voltage source. Additionally or alternatively to one or more of the examples disclosed above, in some examples, the gate line is further coupled to a DC voltage source. Additionally or alternatively to one or more of the examples disclosed above, in some examples, the gate line is coupled to a transistor in the display pixel. Additionally or alternatively to one or more of the examples disclosed above, in some examples, the gate line is further coupled to a second display pixel of the plurality of display pixels.

Some examples of the disclosure are directed to a method for operating a self-capacitance touch screen, the method comprising: coupling a gate line to a first display pixel of a plurality of display pixels, the first display pixel including a first touch electrode of a plurality of touch electrodes; and operating the gate line such that a voltage at the gate line substantially follows a voltage at the first touch electrode. Additionally or alternatively to one or more of the examples disclosed above, in some examples, the voltage at the gate line and the voltage at the first touch electrode comprise an AC voltage. Additionally or alternatively to one or more of the examples disclosed above, in some examples, operating the gate line comprises coupling the gate line to a resistor, the resistor being configured to decouple the gate line from ground. Additionally or alternatively to one or more of the examples disclosed above, in some examples, the resistor is in a border region of the touch screen. Additionally or alternatively to one or more of the examples disclosed above, in some examples, the method further comprises coupling the resistor to an AC voltage source. Additionally or alternatively to one or more of the examples disclosed above, in some examples, the method further comprises coupling the AC voltage source to sense circuitry; and coupling the sense circuitry to the first touch electrode. Additionally or alternatively to one or more of the examples disclosed above, in some examples, operating the gate line comprises coupling the gate line to an AC voltage source. Additionally or alternatively to one or more of the examples disclosed above, in some examples, the method further comprises coupling the first touch electrode and the AC voltage source to sense circuitry. Additionally or alternatively to one or more of the examples disclosed above, in some examples, the method further comprises coupling the gate line to a DC voltage source. Additionally or alternatively to one or more of the examples disclosed above, in some examples, coupling the gate line to the first display pixel comprises coupling the gate line to a transistor in the first display pixel. Additionally or alternatively to one or more of the examples disclosed above, in some examples, the method further comprises coupling the gate line to a second display pixel of the plurality of display pixels.

Some examples of the disclosure are directed to a self-capacitance touch screen, the touch screen comprising: a plurality of display pixels, a first display pixel of the plurality of display pixels including a first touch electrode of a plurality of touch electrodes; a gate line coupled to the first display pixel; and circuitry configured to apply substantially similar voltage signals at the gate line and the first touch electrode. Additionally or alternatively to one or more of the examples disclosed above, in some examples, the gate line is further coupled to a second display pixel of the plurality of display pixels. Additionally or alternatively to one or more of the examples disclosed above, in some examples, the circuitry comprises an AC voltage source coupled to the gate line and to sense circuitry, the sense circuitry being coupled to the first touch electrode. Additionally or alternatively to one or more of the examples disclosed above, in some examples, the sense circuitry comprises an operational amplifier, the AC voltage source is coupled to a non-inverting input of the operational amplifier, and the first touch electrode is coupled to an inverting input of the operational amplifier. Additionally or alternatively to one or more of the examples disclosed above, in some examples, the circuitry further comprises a resistor through which the AC voltage source is coupled to the gate line.

Although examples of this disclosure have been fully described with reference to the accompanying drawings, it is to be noted that various changes and modifications will become apparent to those skilled in the art. Such changes and modifications are to be understood as being included within the scope of examples of this disclosure as defined by the appended claims.

The invention claimed is:

1. A self-capacitance touch screen, the touch screen comprising:
    a plurality of display pixels, a first display pixel of the plurality of display pixels including a first touch electrode of a plurality of touch electrodes; and
    a gate line coupled to the first display pixel, wherein the gate line is coupled to a resistor that:
        decouples the gate line from ground with respect to one or more AC signals such that a voltage difference between the gate line and the first touch electrode remains substantially unchanged while a self-capacitance of the first touch electrode is being sensed, which includes driving the first touch electrode at an AC voltage; and
        allows one or more DC signals for operating the first display pixel to pass onto the gate line during a touch mode of the touch screen.

2. The touch screen of claim 1, wherein the touch screen is configured to enable an AC voltage to be present at both the gate line and the first touch electrode.

3. The touch screen of claim 1, wherein the resistor is in a border region of the touch screen.

4. The touch screen of claim 1, wherein the resistor is coupled to an AC voltage source.

5. The touch screen of claim 4, wherein:
    the AC voltage source is coupled to sense circuitry, and
    the sense circuitry is coupled to the first touch electrode.

6. The touch screen of claim 1, wherein the gate line is coupled to an AC voltage source.

7. The touch screen of claim 6, further comprising sense circuitry coupled to: the first touch electrode, and the AC voltage source.

8. The touch screen of claim 6, wherein the gate line is further coupled to a DC voltage source.

9. The touch screen of claim 1, wherein the gate line is coupled to a transistor in the first display pixel.

10. The touch screen of claim 1, wherein the gate line is further coupled to a second display pixel of the plurality of display pixels.

11. A method for operating a self-capacitance touch screen, the method comprising:
coupling a gate line to:
a first display pixel of a plurality of display pixels, the first display pixel including a first touch electrode of a plurality of touch electrodes; and
a resistor that:
decouples the gate line from ground with respect to one or more AC signals;
allows one or more DC signals for operating the first display pixel to pass onto the gate line during a touch mode of the touch screen; and
operating the gate line such that a voltage difference between the gate line and the first touch electrode remains substantially unchanged while a self-capacitance of the first touch electrode is being sensed, which includes driving the first touch electrode at an AC voltage.

12. The method of claim 11, wherein the voltage at the gate line and the voltage at the first touch electrode comprise an AC voltage.

13. The method of claim 11, wherein the resistor is in a border region of the touch screen.

14. The method of claim 11, further comprising coupling the resistor to an AC voltage source.

15. The method of claim 14, further comprising:
coupling the AC voltage source to sense circuitry; and
coupling the sense circuitry to the first touch electrode.

16. The method of claim 11, wherein operating the gate line comprises coupling the gate line to an AC voltage source.

17. The method of claim 16, further comprising coupling the first touch electrode and the AC voltage source to sense circuitry.

18. The method of claim 16, further comprising coupling the gate line to a DC voltage source.

19. The method of claim 11, wherein coupling the gate line to the first display pixel comprises coupling the gate line to a transistor in the first display pixel.

20. The method of claim 11, further comprising coupling the gate line to a second display pixel of the plurality of display pixels.

* * * * *